(12) United States Patent
Kim et al.

(10) Patent No.: US 10,714,542 B2
(45) Date of Patent: Jul. 14, 2020

(54) DISPLAY DEVICE WITH BENDING SENSING PATTERNS

(71) Applicant: LG DISPLAY CO., LTD., Seoul (KR)

(72) Inventors: MinKyu Kim, Paju-si (KR); MinJi Han, Iksan-si (KR); SungHyun Jang, Paju-si (KR); BoTaek Lee, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 83 days.

(21) Appl. No.: 16/122,222

(22) Filed: Sep. 5, 2018

(65) Prior Publication Data

US 2019/0074332 A1 Mar. 7, 2019

(30) Foreign Application Priority Data

Sep. 5, 2017 (KR) .................. 10-2017-0113498
Aug. 10, 2018 (KR) .................. 10-2018-0093832

(51) Int. Cl.
| | |
|---|---|
| *H01L 27/32* | (2006.01) |
| *G01K 13/00* | (2006.01) |
| *G01B 7/287* | (2006.01) |
| *G01B 7/16* | (2006.01) |
| *G01K 7/16* | (2006.01) |
| *H01L 51/00* | (2006.01) |

(52) U.S. Cl.
CPC ............ *H01L 27/3225* (2013.01); *G01B 7/16* (2013.01); *G01B 7/18* (2013.01); *G01B 7/287* (2013.01); *G01K 7/16* (2013.01); *G01K 13/00* (2013.01); *H01L 27/3262* (2013.01); *H01L 27/3276* (2013.01); *H01L 51/0097* (2013.01); H01L 27/3248 (2013.01); H01L 27/3258 (2013.01); H01L 2251/5338 (2013.01)

(58) Field of Classification Search
CPC combination set(s) only.
See application file for complete search history.

(56) References Cited

U.S. PATENT DOCUMENTS

| | | | | |
|---|---|---|---|---|
| 2014/0217373 | A1* | 8/2014 | Youn ................. | H05K 1/0281 257/40 |
| 2014/0319523 | A1* | 10/2014 | Lee ..................... | G09G 3/20 257/48 |
| 2016/0190216 | A1* | 6/2016 | Yang .................. | H01L 27/3225 257/91 |
| 2018/0158741 | A1* | 6/2018 | Kim ................... | H01L 22/12 |
| 2018/0217006 | A1* | 8/2018 | Choi .................. | G01K 7/223 |
| 2018/0366529 | A1* | 12/2018 | Lee ................... | H01L 51/0031 |

FOREIGN PATENT DOCUMENTS

KR 10-2013-0015542 A 2/2013

* cited by examiner

*Primary Examiner* — Nduka E Ojeh
(74) *Attorney, Agent, or Firm* — Birch, Stewart, Kolasch & Birch, LLP

(57) ABSTRACT

The present disclosure discloses is a display device including a flexible substrate having an active area, a bezel area enclosing the active area, and a bending area defined in at least a part of the active area and the bezel area; and a plurality of bending sensing patterns disposed in the bending area, in which the bending area includes a plurality of sub bending areas and the plurality of bending sensing patterns is disposed in different areas of the plurality of sub bending areas, so that the bending degree of each sub bending area included in the bending area can be independently sensed.

31 Claims, 15 Drawing Sheets

DISPLAY DEVICE WITH BENDING SENSING PATTERNS

CROSS-REFERENCE TO RELATED APPLICATIONS

This application claims the priority benefit of Korean Patent Application No. 10-2017-0113498 filed on Sep. 5, 2017 and Korean Patent Application No. 10-2018-0093832 filed on Aug. 10, 2018, both filed in the Korean Intellectual Property Office, the disclosure of each which is incorporated herein by reference in its entirety.

BACKGROUND OF THE INVENTION

Field of the Invention

The present disclosure relates to a display device, and more particularly, to a display device in which a plurality of bending sensing patterns which senses bending of the display device is disposed in different areas in a bending area of the display device.

Description of the Related Art

Recently, a flexible display device is manufactured by forming a display unit and a wiring line on a flexible substrate formed of a material such as plastic. Thus, the flexible display is capable of displaying images even though the display device is bent like a paper, and is getting attention as a next generation display device. An applicable range of the flexible display device expands not only to a monitor of a computer and a television, but also to a personal portable device. Further, a flexible display device having a large display area but reduced volume and weight is being studied.

Furthermore, the bending or folding of the flexible display device may cause damages to internal elements. Thus, there is demand by a user to sense how much the flexible display device is bent or folded. Therefore, studies are performed to manufacture a flexible display device by attaching a bending sensor which is separately manufactured to the flexible display device.

A related technique is disclosed in Korean Patent Application No. 10-2011-0077585 titled "Electronic apparatus and control method thereof".

SUMMARY OF THE INVENTION

A sensor can be used to sense a bending degree in a bending area to sense how much the display device is bent. Thus, the bending degree can be determined by applying a voltage on both ends of the sensor and measuring a resistance of the sensor based on a current flowing through the sensor. However, when one bending sensor is disposed in the entire bending area, it is difficult to sense a bending degree for every each position of the bending area. Further, since the bending sensor is disposed in the entire bending area, a change in the resistance of the bending sensor is small. Therefore, it is difficult to sense an accurate bending degree.

Therefore, embodiments of the present disclosure provide a display device having a new structure which measures a bending degree for every each position in the bending area.

Therefore, an object to be achieved by the present disclosure is to provide a display device disposed therein a plurality of bending sensing patterns along a bending direction in a bending area.

Further, another object to be achieved by the present disclosure is to provide a display device in which the bending area is divided in a direction perpendicular to the bending direction, and a plurality of bending sensing patterns are disposed in the respective divided bending areas.

Still another object to be achieved by the present disclosure is to provide a display device in which one planarization layer which covers bending sensing patterns and the other planarization layer which covers wiring lines are separated from each other to suppress propagation of cracks.

Objects of the present disclosure are not limited to the above-mentioned objects, and other objects, which are not mentioned above, can be clearly understood by those skilled in the art from the following descriptions.

According to an aspect of the present disclosure, there is provided a display device including: a flexible substrate having an active area, a bezel area enclosing the active area, and a bending area which is defined in at least a part of the active area and the bezel area; and a plurality of bending sensing patterns disposed in the bending area, in which the bending area includes a plurality of sub bending areas, and the plurality of bending sensing patterns are disposed in different areas of the plurality of sub bending areas. Therefore, the bending degree of each of the sub bending areas included in the bending area can be independently sensed.

According to another aspect of the present disclosure, there is provided a display device including a flexible substrate which is configured by a plurality of sub bending areas and has a curved bending area and a plurality of bending sensing patterns which are disposed in the plurality of sub bending areas, respectively, to detect a stress deviation in each of the plurality of sub bending areas generated as the bending area is bent. Therefore, a sub bending area which is cracked or is not accurately bent, among the sub bending areas included in the bending area can be more easily identified.

The inventors of the present disclosure invented a display device such that a change of a resistance of the display device is measured to sense the damage of elements due to a temperature. Therefore, an object to be achieved by the present disclosure is to provide a display device having a temperature monitoring pattern.

Further, the inventors of the present disclosure invented a display device to reduce a size of a bezel area where the bending sensing pattern and the temperature monitoring pattern are disposed. Therefore, an object to be achieved by the present disclosure is to provide a display device in which the temperature monitoring pattern and the bending monitoring pattern disposed in the bezel area share one of a plurality of pads. Moreover, another object to be achieved by the present disclosure is to provide a display device in which the temperature monitoring pattern has different shape from the bending monitoring pattern to reduce an area where the temperature monitoring pattern is disposed.

Other detailed matters of the embodiments are included in the detailed description and the drawings.

According to the present disclosure, a plurality of bending sensing patterns disposed along the bending direction are used to accurately sense a bending degree of each position of the bending area and whether the bending area is accurately bent.

Further, according to the present disclosure, a density of a bending sensing pattern disposed in a bending area having a small radius of curvature is larger than a density of a bending sensing pattern disposed in a bending area having a large radius of curvature so that the bending degree can be more precisely sensed.

According to the present disclosure, a temperature monitoring pattern is disposed to measure a change of a resistance of the display device so that the damage of elements due to a temperature can be sensed.

Further, according to the present disclosure, the temperature monitoring pattern and the bending monitoring pattern disposed in a bezel area share one of a plurality of pads so that a size of the bezel area in the display device can be reduced.

Further, according to the present disclosure, the temperature monitoring pattern can be formed to have different shape from the bending monitoring pattern formed in the same direction as the bending direction of the display device. Therefore, the temperature monitoring pattern is formed to reduce an area where the temperature monitoring pattern is disposed so that the size of the bezel area in the display device can be reduced.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
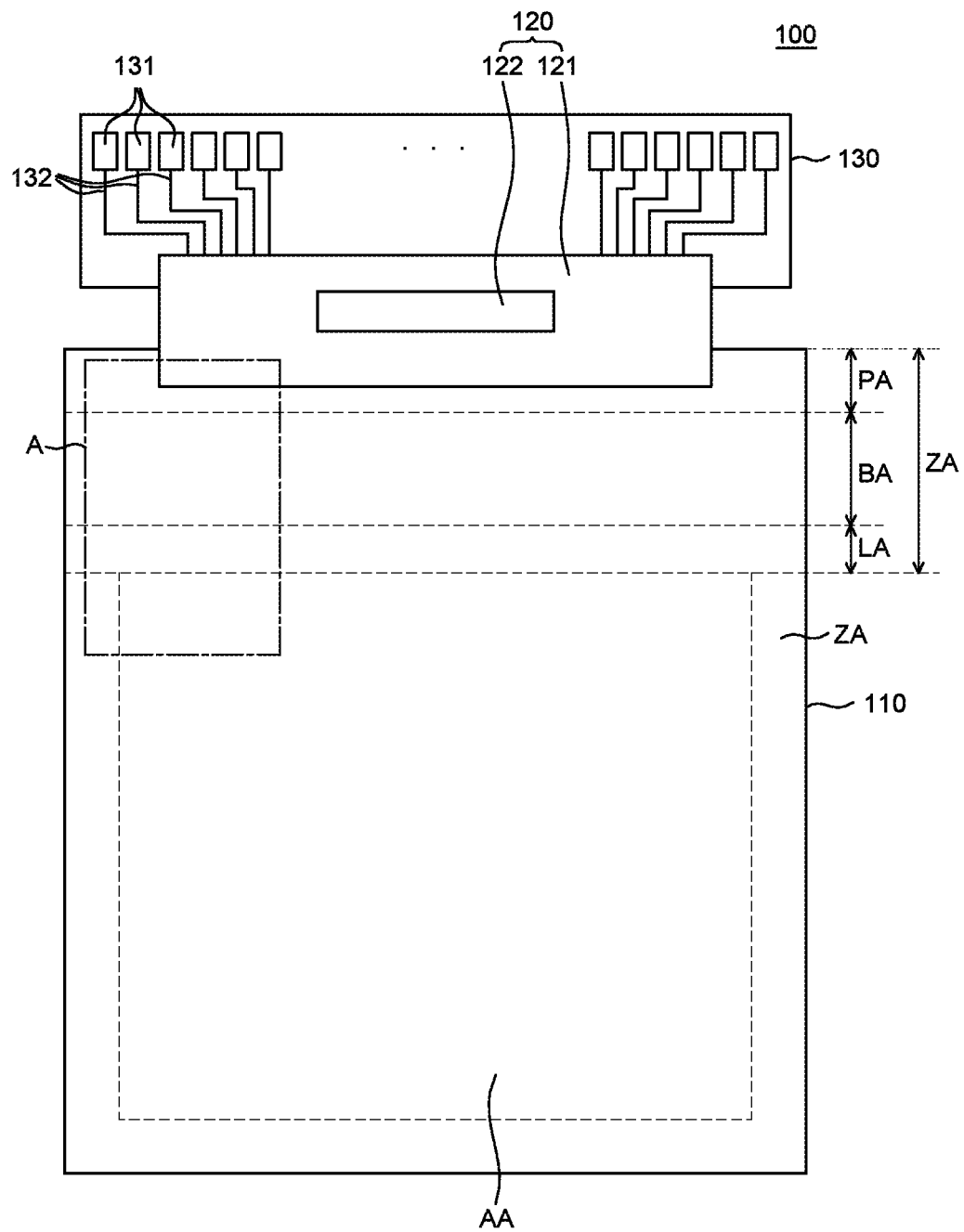
FIG. 1 is a schematic plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that a person of ordinary skill in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts can be positioned between the two parts unless the terms are used with the term "immediately" or "directly".

When an element or layer is disposed "on" another element or layer, another layer or another element can be interposed directly on the other element or therebetween.

Although the terms "first", "second", and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely bonded to or combined with each other and can be interlocked and operated in technically various ways understood by those skilled in the art, and the embodiments can be carried out independently of or in association with each other.

Hereinafter, various example embodiments of the present disclosure will be described in detail with reference to accompanying drawings.

FIG. 1 is a schematic plan view of a display device according to an example embodiment of the present disclosure.

Referring to FIG. 1, a display device 100 includes a flexible substrate 110, a chip on film (COF) 120, and a printed circuit board 130.

The flexible substrate 110 can be a substrate which supports and protects several components of the display device 100. The flexible substrate 110 can be configured by an insulating material having flexibility. For example, the flexible substrate 110 can be formed of plastic such as polyimide, but is not limited thereto.

The flexible substrate 110 has an active area AA and a bezel area ZA enclosing the active area AA. In the bezel area ZA, a bending area BA, a link area LA, and a pad area PA are defined.

The active area AA can be an area in which an image can be displayed in the display device 100 and a display element and various driving elements for driving the display element can be disposed in the active area AA.

The bezel area ZA can be an area which encloses the active area AA. The bezel area ZA can be an area where no image is displayed in the display device 100 and wiring lines or circuit units can be formed therein. The bezel area ZA includes a link area LA, a bending area BA, and a pad area PA.

The link area LA extends from one side of the active area AA. The link area LA can be an area where link lines transmitting signals to wiring lines disposed in the active area AA can be disposed and various link lines can be disposed therein. For example, a data link line DLL, a high potential voltage supply line, and the like can be disposed in the link area LA.

The bending area BA refers to an area where the flexible substrate 110 can be bent. The bending area BA extends from one side of the link area LA. The flexible substrate 110 can be configured to be maintained to be flat without being bent in an area excepting the bending area BA and bent only in the bending area BA. Therefore, the display device 100 can be bent such that two non-bending areas excluding the bending area BA of the flexible substrate 110 face each other.

The pad area PA can be an area in which no image is displayed and a plurality of pads P can be formed. The pad area PA extends from one side of the bending area BA. The pad area PA can be an area in which the plurality of pads P and an external module, for example, a COF 120 can be bonded.

The COF 120 can be a film on which various components can be disposed on a flexible base film 121 and supplies signals to the pixel PX of the active area AA. The COF 120 can be disposed in the pad area PA of the bezel area ZA to supply a power voltage or a data voltage to the pixel PX of the active area AA through the pads P disposed in the pad area PA. The COF 120 includes a base film 121 and a driving IC 122. Further, various components can be additionally disposed on the COF.

The base film 121 can be a layer which supports the COF 120. The base film 121 can be formed of an insulating material, for example, can be formed of a flexible insulating material.

The driving IC 122 can be a component which processes data for displaying images and a driving signal for processing the data. In FIG. 1, even though it is illustrated that the driving IC 122 can be mounted by the COF 120 technology, it is not limited thereto and the driving IC can be mounted by a technology such as chip on glass (COG) or tape carrier package (TCP).

A control unit such as an IC chip or a circuit unit can be mounted on the printed circuit board 130. Further, on the printed circuit board 130, a memory or a processor can be mounted. The printed circuit board 130 has a configuration in which a signal for driving the display element can be transmitted from the control unit to the display element and a measuring pad 131 and a measuring line 132 for sensing a bending angle of the display device 100 can be disposed. The plurality of pads P of the pad area PA can be connected to a plurality of measuring lines 132 and a plurality of measuring pads 131 of the printed circuit board 130 through the COF 120. The bending angle of the bending area BA can be sensed through some of the measuring pads 131 connected to the bending sensing pattern. The bending sensing line 150 connected to the bending sensing pattern can be connected to the measuring pad 131. Therefore, a voltage can be applied to the measuring pad 131 to measure a flowing current and thus the resistance of the bending sensing line 150 can be measured so that the bending angle can be sensed.

Hereinafter, the display device 100 according to an example embodiment of the present disclosure will be described in more detail with reference to FIGS. 2 and 3.

Figure 2:
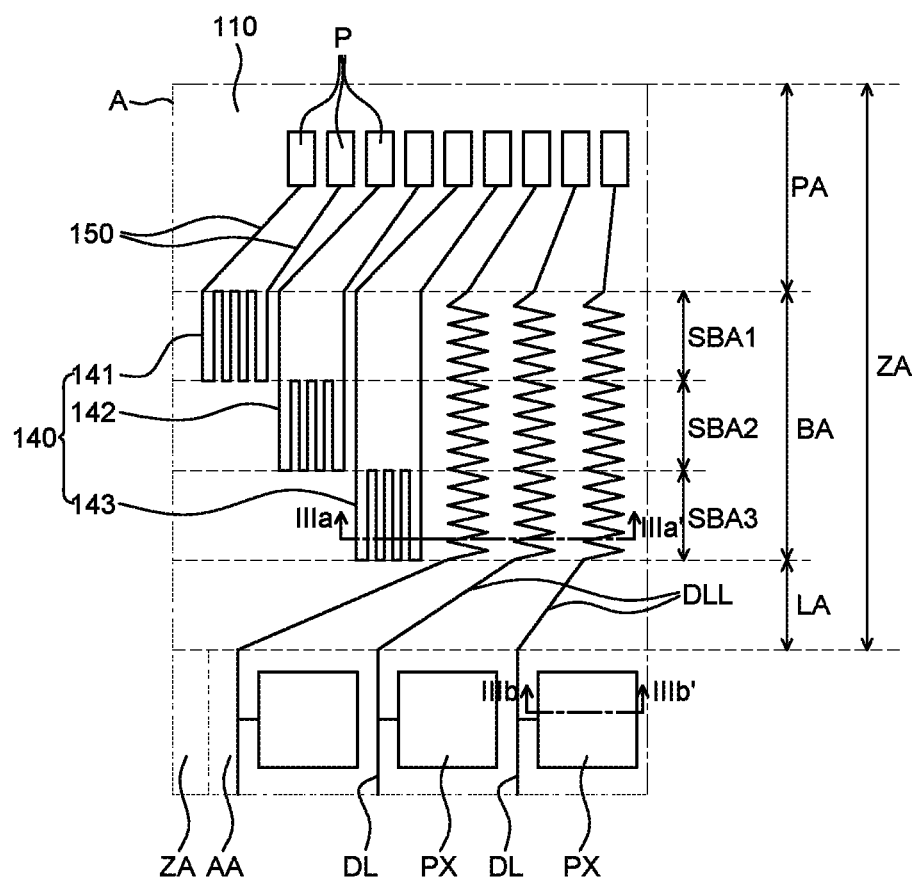
FIG. 2 is an enlarged view of an A area of FIG. 1.

FIG. 2 is an enlarged view of an A area of FIG. 1. FIG. 3 is a schematic cross-sectional view taken along the lines IIIa-IIIa' and IIIb-IIIb' of FIG. 2. In FIG. 2, for the convenience of description, a display device 100 in which the COF 120 is not yet bonded is illustrated.

Figure 3:
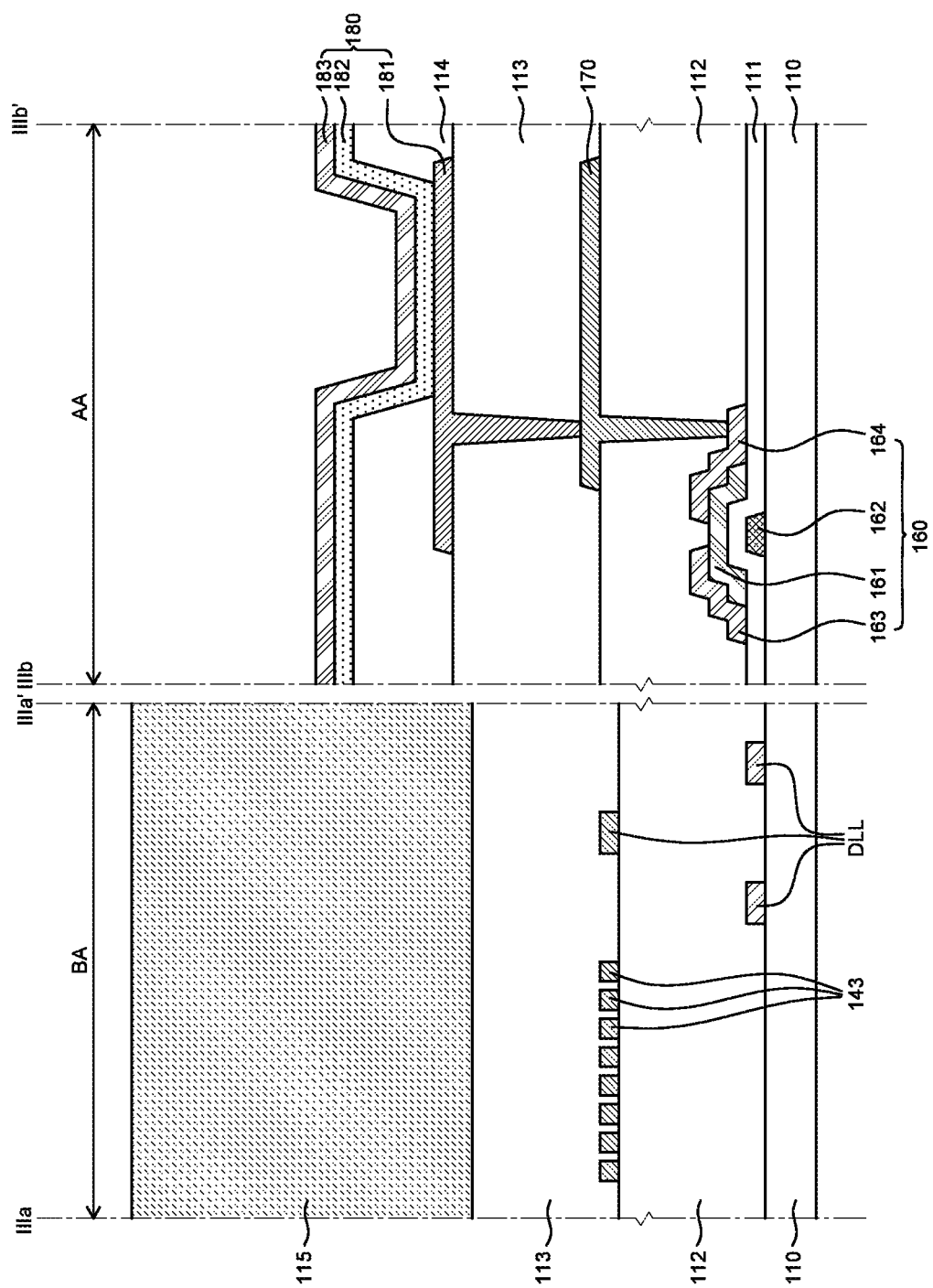
FIG. 3 is a schematic cross-sectional view taken along the lines IIIa-IIIa' and IIIb-IIIb' of FIG. 2.

Referring to FIGS. 2 and 3, the active area AA includes a plurality of pixels PX. The plurality of pixels PX can be disposed in the active area AA and includes elements such as a thin film transistor 160. The plurality of pixels PX can be connected to data lines DL. The data lines DL refer to wiring lines which transmit a data signal to the plurality of pixels PX.

Referring to FIG. 3, in the active area AA, the thin film transistor 160 can be disposed on a flexible substrate 110. A gate electrode 162 can be formed on the flexible substrate 110 and a gate insulating layer 111 can be formed on an active layer 161. The gate insulating layer 111 can be formed of an inorganic material such as silicon nitride (SiNx) or silicon oxide (SiOx) and can be formed of a single layer or a plurality of layers. On the gate insulating layer 111, the active layer 161 in which a channel of the thin film transistor 160 can be formed is disposed. A source electrode 163 and a drain electrode 164 can be formed on the active layer 161. In FIG. 3, even though it is illustrated that the thin film transistor 160 can be a bottom gate type thin film transistor 160, a lamination structure of the thin film transistor 160 is not limited thereto.

A first planarization layer 112 can be disposed on the thin film transistor 160. The first planarization layer 112 can be an insulating layer which planarizes an upper portion of the thin film transistor 160. The first planarization layer 112 can be formed of an organic material. For example, the first planarization layer 112 can be formed of an acrylic organic material, but is not limited thereto.

A connection electrode 170 can be disposed on the first planarization layer 112. The connection electrode 170 can be an electrode which electrically connects the thin film transistor 160 and a light emitting element 180. The connection electrode 170 can be electrically connected to the drain electrode 164 of the thin film transistor 160 through a contact hole formed on the first planarization layer 112. The connection electrode 170 can be formed of the same material as the source electrode 163 and the drain electrode 164 of the thin film transistor 160, but is not limited thereto.

A second planarization layer 113 can be disposed on the connection electrode 170 and the first planarization layer 112. The second planarization layer 113 can be an insulating layer which planarizes an upper portion of the connection electrode 170. The second planarization layer 113 can be formed of an organic material. For example, the second planarization layer 113 can be formed of an acrylic organic material, but is not limited thereto. Further, the second planarization layer 113 can be formed of the same material as the first planarization layer 112, but is not limited thereto.

An anode 181 of the light emitting element 180 can be disposed on the second planarization layer 113. The anode 181 can be disposed on the second planarization layer 113 and can be electrically connected to the connection electrode 170 through a contact hole formed on the second planarization layer 113. The anode 181 can be formed of a conductive material having a high work function to supply holes to the light emitting layer 182. For example, the anode 181 can be formed of a transparent conductive material such as indium tin oxide (ITO), indium zinc oxide (IZO), or indium tin zinc oxide (ITZO). When the display device 100 can be a top emission type, the anode 181 may further include a reflector.

A bank 114 can be disposed on the anode 181 and the second planarization layer 113. The bank 114 can be an insulating layer which divides the plurality of adjacent pixels PX. The bank 114 can be disposed to cover at least a part of both sides of the anode 181 to expose a part of an upper surface of the anode 181. The bank 114 can be formed of acrylic resin, benzocyclobutene (BCB) resin, or polyimide, but is not limited thereto.

The light emitting layer 182 can be disposed on the anode 181 and the bank 114. The light emitting layer 182 can be any one of light emitting layers 182 which emit red light, green light, blue light, and white light. In addition to a light emitting layer which emits light, the light emitting layer 182 may further include at least one of a hole transport layer, an electron transport layer, a hole blocking layer, an electron blocking layer, a hole injection layer, and an electron injection layer. In FIG. 3, even though it is illustrated that the light emitting layer 182 can be a common layer formed on the plurality of pixels PX, it is not limited thereto and the light emitting layer 182 can be patterned for each of the plurality of pixels PX.

The cathode 183 can be disposed on the light emitting layer 182. The cathode 183 supplies electrons to the light emitting layer 182. The cathode 183 can be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 183 can be formed of a metal material.

Referring to FIG. 2, the data link line DLL can be disposed in the link area LA, the bending area BA, and the pad area PA to connect the data line DL of the active area AA and the pad P of the pad area PA. In the bending area BA, the data link line DLL can have various shapes such as a zigzag pattern or a rhombus shape to minimize the crack of the data link line DLL according to the bending of the bending area BA. For example, as illustrated in FIG. 2, the data link line DLL can have a zigzag pattern in the bending area BA.

Referring to FIG. 3, the plurality of data link lines DLL can be disposed on different layers. That is, some of the data link lines DLL can be disposed on the flexible substrate 110 and the others can be disposed on the first planarization layer 112. As the display device can be designed to have high resolution, the number of data link lines DLL disposed in the bezel area ZA needs to be correspondingly increased. However, when the data link lines DLL can be disposed on one layer, a space where the data link lines DLL can be disposed can be very narrow so that there can be a difficulty in design. Therefore, in the display device 100 according to the example embodiment of the present disclosure, some of the data link lines DLL can be disposed on the flexible substrate 110 and the others can be disposed on the first planarization layer 112 so that an arrangement of the data link lines DLL can be easily designed and a size of the bezel area ZA can be reduced.

In some example embodiments, some of the data link lines DLL can be electrically connected to each other. For example, one of the data link lines DLL disposed on the flexible substrate 110 and one of the data link lines DLL disposed on the first planarization layer 112 can be electrically connected to each other so that two data link lines DLL can be connected in parallel. Alternatively, two data link lines DLL disposed on the same layer can be electrically connected to each other. Therefore, the resistance of the data link line DLL can be reduced. Further, even though one of the two data link lines DLL which can be connected to each other can be cracked, the signal can be normally transmitted.

Referring to FIG. 2, the bending area BA can include a plurality of sub bending areas SBA1, SBA2, and SBA3. For example, the bending area BA can include a first sub bending area SBA1, a second sub bending area SBA2, and a third sub bending area SBA3. The plurality of sub bending areas SBA1, SBA2, and SBA3 can be sequentially disposed from one side of the bending area BA to the other side. That is, the third sub bending area SBA3, the second sub bending area SBA2, and the first sub bending area SBA1 can be sequentially disposed from the link area LA of the bending area BA. However, the number of sub bending areas included in the bending area BA is not limited thereto.

Referring to FIG. 2, the display device 100 can include a plurality of bending sensing patterns 140 disposed in the bending area BA. The plurality of bending sensing patterns 140 can be patterns for sensing a degree to which the bending area BA of the display device 100 can be bent. The resistance of the plurality of bending sensing patterns 140 can be changed according to the bending of the bending area BA of the display device 100 and the degree to which display device 100 can be bent is sensed according to the measured resistance. That is, the plurality of bending sensing patterns 140 can be configured to detect a stress deviation in the plurality of sub bending areas SBA1, SBA2, and SBA3 which can be generated according to the bending of the bending area BA. When the bending area BA is bent, the bending degrees of the plurality of sub bending areas SBA1, SBA2, and SBA2 can be different from each other. Therefore, there can be a deviation in the stress which can be applied to each of the plurality of sub bending areas SBA1, SBA2, and SBA3. The plurality of bending sensing patterns 140 can be disposed in each of the plurality of sub bending areas SBA1, SBA2, and SBA3 to detect the stress applied to each of the plurality of sub bending areas SBA1, SBA2, and SBA3 and thus calculate the deviation of the stress.

For example, as illustrated in FIG. 2, the plurality of bending sensing patterns 140 can include a first bending sensing pattern 141, a second bending sensing pattern 142, and a third bending sensing pattern 143. In this instance, the plurality of bending sensing patterns 140 can be disposed in different areas of the plurality of sub bending areas SBA1, SBA2, and SBA3. That is, the first bending sensing pattern 141 can be disposed in the first sub bending area SBA1, the second bending sensing pattern 142 can be disposed in the second sub bending area SBA2, and the third bending sensing pattern 143 can be disposed in the third sub bending area SBA3.

The plurality of bending sensing patterns 140 can be disposed on both sides of the plurality of data link lines DLL. That is, in the bending area BA, the plurality of data link lines DLL can be disposed at a center portion and the plurality of bending sensing patterns 140 can be disposed on left and right sides of the center portion where the plurality of data link lines DLL can be disposed. However, it is not limited thereto and the plurality of bending sensing patterns 140 can be located at a center portion of the bending area BA or located only one side of the left and right sides of the center portion.

The plurality of bending sensing patterns 140 can be connected to the plurality of bending sensing lines 150. The plurality of bending sensing lines 150 can be connected to the plurality of pads P to electrically connect the plurality of bending sensing patterns 140 to the plurality of pads P.

The plurality of bending sensing patterns 140 can be disposed in a diagonal direction along the bending direction of the bending area BA. That is, as illustrated in FIG. 2, the first bending sensing pattern 141, the second bending sensing pattern 142, and the third bending sensing pattern 143 can be disposed in the diagonal direction with respect to the bending direction of the bending area BA.

The plurality of bending sensing patterns 140 can be configured by a plurality of sub patterns extending in different directions. Referring to FIG. 2, the plurality of bending sensing patterns 140 includes a sub pattern extending in a direction parallel to the bending direction of the bending area BA and a sub pattern extending in a different direction from the bending direction, for example, a sub pattern extending in a direction perpendicular to the bending direction.

In this instance, at least some of the plurality of sub patterns can be parallel to the bending direction of the bending area BA. When at least some of the plurality of sub patterns can be disposed to be parallel to the bending direction of the bending area BA, the plurality of bending sensing patterns 140 can effectively sense the bending degree of the display device 100. When the plurality of sub patterns can be disposed to be parallel to the bending direction of the bending area BA, the stress applied to the plurality of bending sensing patterns 140 can be increased as compared with the instance when the plurality of sub patterns can be disposed not to be parallel to the bending direction of the bending area BA. Therefore, when the bending area BA is bent, the stress applied to the plurality of sub patterns can be increased so that the changed amount of the resistance of the plurality of bending sensing patterns 140 according to the bending of the bending area BA can also be increased. Therefore, the display device 100 according to the example embodiment of the present disclosure can effectively sense the bending degree. The plurality of bending sensing patterns 140 can be formed of lines that can be arranged back and forth to look like fingers or a plurality of extensions and recesses. Each of the fingers of the plurality of bending sensing patterns 140 can be spaced apart at regular intervals from each other, but such is not required. For example, each of the fingers of the plurality of bending sensing patterns 140 can be spaced apart by different distances or spacing. Widths and lengths of the fingers of the plurality of bending sensing patterns 140 can be the same or different.

Referring to the cross-sectional view taken along the line IIIa-IIIa' of FIG. 3, some of the plurality of data link lines DLL can be disposed on the flexible substrate 110. Some of the plurality of data link lines DLL can be formed of the same material as the source electrode 163 or the drain electrode 164 of the thin film transistor 160. That is, some of the plurality of data link lines DLL can be simultaneously formed by the same process as the source electrode 163 or the drain electrode 164. In FIG. 3, even though it is illustrated that some of the plurality of data link lines DLL can be in direct contact with the flexible substrate 110, on the flexible substrate 110, one or more insulating layers can be disposed and some of the plurality of data link lines DLL can be disposed.

The first planarization layer can be disposed on some of the plurality of data link lines DLL and the third bending sensing pattern 143, and the remainder of the plurality of data link lines DLL can be disposed on the first planarization layer 112. That is, the plurality of bending sensing patterns 140 and the remainder of the plurality of data link lines DLL can be disposed on the same layer. The plurality of bending sensing patterns 140 and the remainder of the plurality of data link lines DLL can be simultaneously formed of the same material as the connection electrode 170 by the same process. In this instance, the plurality of data link lines DLL can be divided to be disposed between the flexible substrate 110 and the first planarization layer 112 and between the first planarization layer 112 and the second planarization layer 113 to minimize an area occupied by the plurality of data link lines DLL.

The plurality of bending sensing patterns 140 can be formed of an uppermost conductive layer among the conductive layers disposed in the bending area BA. In the display device 100 according to the example embodiment of the present disclosure, the plurality of bending sensing patterns 140 can be formed of an uppermost conductive layer among the conductive layers disposed in the bending area BA so that the bending can be effectively sensed. Specifically, when the bending area BA of the display device 100 is bent, the stress which can be applied to the uppermost conductive layer among the conductive layers disposed in the bending area BA can be the largest. Therefore, the resistance variation of the uppermost conductive layer among the conductive layers disposed in the bending area BA can be the largest. Therefore, the display device 100 according to the example embodiment of the present disclosure uses the uppermost conductive layer among the conductive layers disposed in the bending area BA as the plurality of bending sensing patterns 140 to effectively sense the bending.

The second planarization layer 113 can be disposed on the third bending sensing pattern 143, and the remainder of the plurality of data link lines DLL. The second planarization layer 113 can planarize upper portions of the third bending sensing pattern 143 and the plurality of data link lines DLL.

A micro coating layer (MCL) 115 can be disposed on the second planarization layer 113. The micro coating layer 115 can be formed of an insulating material such as an organic material. For example, the micro coating layer 115 can be formed of an acrylic material or urethane acrylate. The micro coating layer 115 serves to adjust a neutral plane in the bending area BA to suppress the wiring lines disposed in the bending area BA from being cracked at the time of being bent.

As the bending area BA is bent, various wiring lines disposed in the bending area BA of the display device 100 can be damaged. For example, as the bending area BA is bent, when excessive stress is applied to some of the plurality of data link lines DLL to cause cracks or increase the resistance, in some of the plurality of bending sensing patterns 140 corresponding to a position where the crack is generated, the crack can be caused (or generated) or the resistance can be increased. Therefore, in the display device 100 according to the example embodiment of the present disclosure, it is determined whether the wiring line disposed in the bending area BA is damaged by measuring a change in resistance of the plurality of bending sensing patterns 140 disposed in the plurality of sub bending areas SBA1, SBA2, and SBA3. That is, when a predetermined voltage is applied to the plurality of measuring pads 131 on the printed circuit board 130 which is electrically connected to the plurality of bending sensing patterns 140 disposed in the plurality of sub bending areas SBA1, SBA2, and SBA3 and a flowing current can be measured, the resistance in each of the bending sensing patterns can be calculated. In this instance, a deviation between the calculated resistance and an expected resistance can be large or exceeds a predetermined reference value, it can be confirmed that the wiring line disposed in the bending area BA is cracked or excessive stress is applied. Specifically, in the display device 100 according to the example embodiment of the present disclosure, not one bending sensing pattern is disposed to correspond to the entire bending area BA, but the plurality of bending sensing patterns 140 can be disposed in the bending area BA so that a degree to which the stress is applied is measured for every sub bending area. Therefore, it is possible to more precisely determine an abnormal area. Therefore, during a manufacturing process of a display device 100 which can be manufactured later than the display device 100 in which the crack and/or excessive stress of the wiring line can be identified, a process of bending the bending area BA can be quickly and accurately corrected.

In the meantime, during the process of bending the bending area BA of the display device 100, the bending area BA can be bent to be shifted from the design. For example, during the process of bending the display device 100, the display device 100 is not accurately bent with respect to a boundary of the bending area BA and the link area LA, but can be bent in a diagonal direction of the boundary of the bending area BA and the link area LA. In this instance, the plurality of corresponding bending sensing patterns 140 disposed on both sides of the plurality of data link lines DLL can have different resistances. When the display device 100 is accurately bent, the corresponding sensing patterns with respect to the plurality of data link lines DLL have substantially the same bending degree so that the resistances of the bending sensing patterns can be substantially equal to each other. However, when the display device 100 is bent to be shifted, a difference in resistances of the bending sensing pattern disposed on the left side of the data link line DLL and the bending sensing pattern disposed on the right side can be very large. Therefore, it is determined whether the display device 100 is accurately bent by comparing the resistances of the bending sensing patterns disposed in the corresponding sub bending areas. Therefore, in the display device 100 according to the example embodiment of the present disclosure, the plurality of bending sensing patterns 140 can be disposed in the plurality of sub bending areas SBA1, SBA2, and SBA3 to determine whether the display device 100 is accurately bent. Moreover, when it is determined that the display device 100 is not accurately bent, during the manufacturing process of a display device 100 which is manufactured later than the corresponding display device 100, the process of bending the bending area BA can be quickly and accurately corrected.

Figure 4:
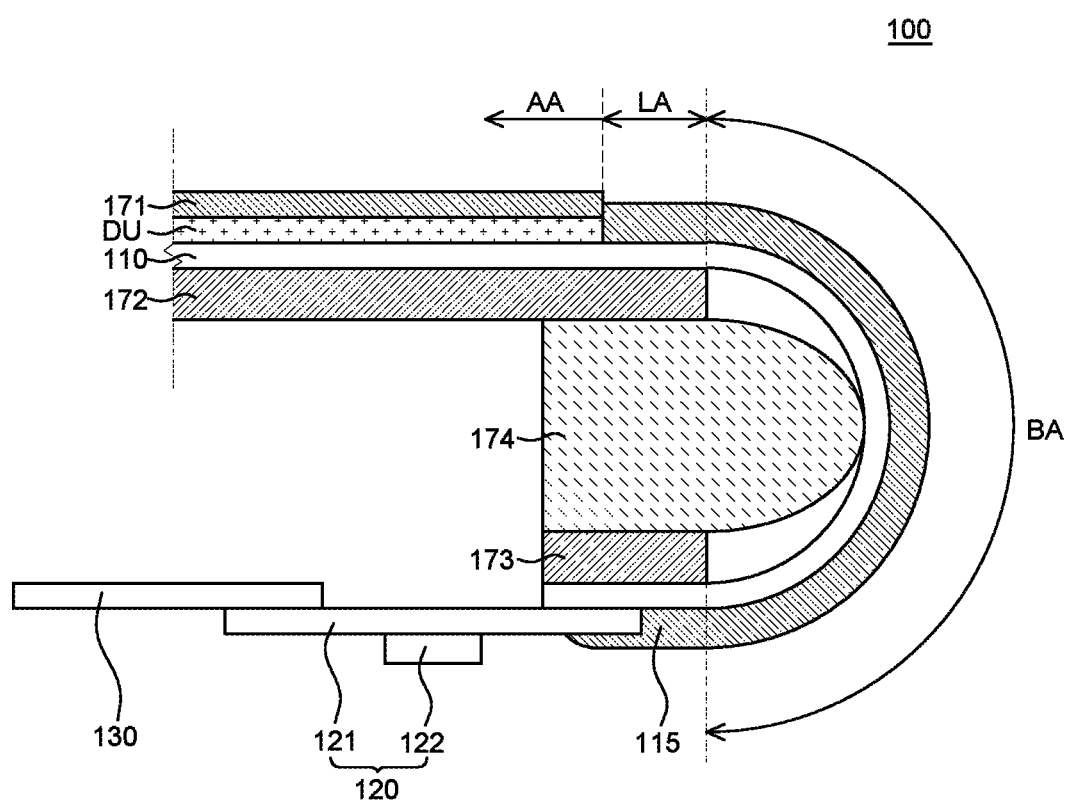
FIG. 4 is a schematic cross-sectional view of the display device illustrated in FIG. 1 which is bent.

FIG. 4 is a schematic cross-sectional view of the display device illustrated in FIG. 1 which is bent. In FIG. 4, for the convenience of description, configurations excluding the flexible substrate 110, the micro coating layer 115, the COF 120, and the printed circuit board 130 of the display device 100 are not illustrated.

Referring to FIG. 4, the bending area BA of the flexible substrate 110 can be bent. The bending area BA can be bent in a semicircular shape. As the flexible substrate 110 is bent, the COF 120 and the printed circuit board 130 can be disposed to be opposite to the active area AA.

A display unit DU can be disposed on the active area AA of the flexible substrate 110. The display unit DU can be a configuration for displaying an image from the display device 100 and includes the thin film transistor 160 and the light emitting element 180 illustrated in FIG. 3. A polarizer 171 can be disposed on the display unit DU. The polarizer 171 can suppress external reflection of the display device 100. Further, the micro coating layer 115 can be formed in a part of the bezel area ZA of the flexible substrate 110. That is, the micro coating layer 115 can be formed in the link area LA, the bending area BA, and the pad area PA of the bezel area ZA.

A first back plate 172 and a second back plate 173 can be disposed below an area of the flexible substrate 110 which is not bent excluding the bending area BA. Specifically, the first back plate 172 can be disposed below the active area AA and the link area LA of the flexible substrate 110 and the second back plate 173 can be disposed below the pad area PA of the flexible substrate 110. When the flexible substrate 110 is formed of a plastic material such as polyimide (PI), the manufacturing process of the display device 100 can be performed under a circumstance when a support substrate formed of glass is disposed below the flexible substrate 110 and the support substrate can be released after completing the manufacturing process of the display device 100. However, since a component for supporting the flexible substrate 110 can be necessary even after releasing the support substrate, the first back plate 172 and the second back plate 173 for supporting the flexible substrate 110 can be disposed below the flexible substrate 110. The first back plate 172 and the second back plate 173 can be disposed to be adjacent to the bending area BA in other area of the flexible substrate 110 excluding the bending area BA. The back plates can be formed of a plastic thin film formed of polyimide (PI), polyethylene naphthalate (PEN), polyethylene terephthalate (PET), other appropriate polymers, and a combination of the polymers.

A support member 174 can be disposed between the first back plate 172 and the second back plate 173 and the support member 174 can be adhered to the first back plate 172 and the second back plate 173 by an adhesive layer. The support member 174 can be formed of a plastic material such as polycarbonate (PC), polyimide (PI), polyethylene naphthalate (PEN), polyethylene terephthalate (PET), other appropriate polymers, and a combination of the polymers. A strength of the support member 174 formed of the plastic materials can be controlled by providing additives for increasing a thickness and/or strength of the support member 174. The support member 174 can be formed to have a target color (for example, black or white). Further, the support member 174 can be formed of glass, ceramic, metal, other rigid materials, or a combination of the above-mentioned materials.

Figure 5:
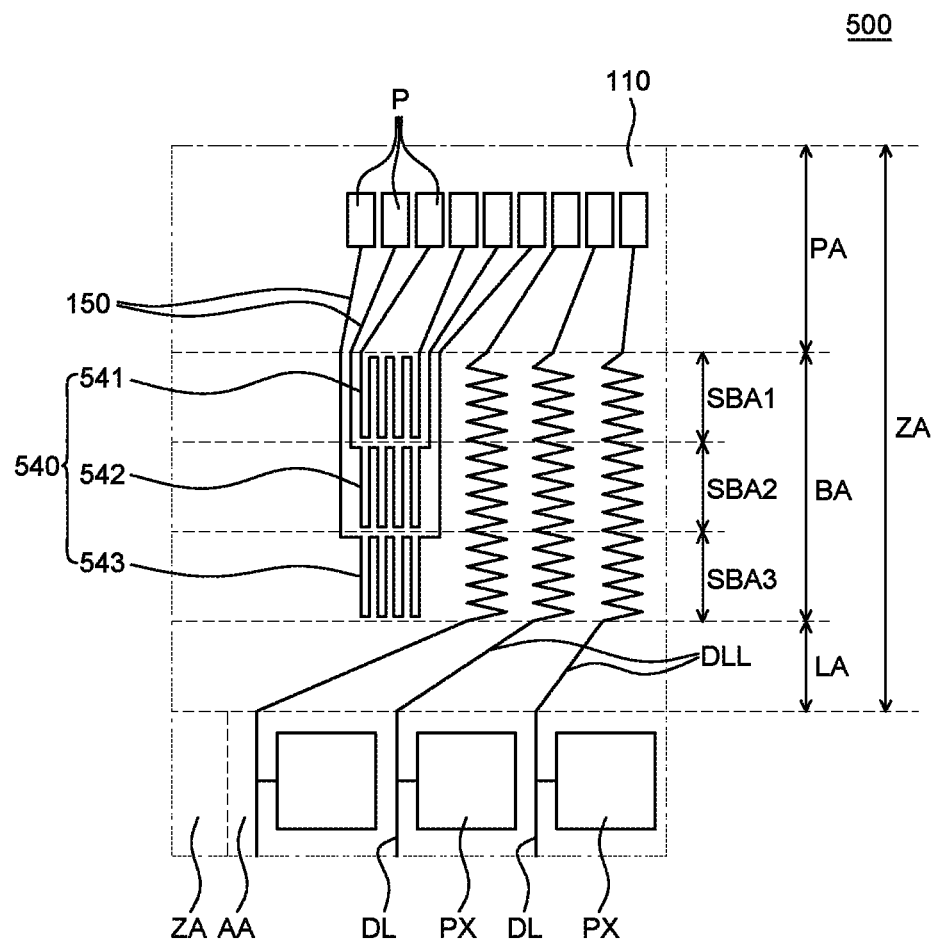
FIG. 5 is an enlarged plan view of a part of a bending area of a display device according to another example embodiment of the present disclosure.

FIG. 5 is an enlarged plan view of a part of a bending area of a display device according to another example embodiment of the present disclosure. A display device 500 illustrated in FIG. 5 can be substantially the same as the display device 100 illustrated in FIGS. 1 and 2 except that the arrangement of the plurality of bending sensing patterns 540 can be different so that a redundant description will be omitted.

Referring to FIG. 5, the plurality of bending sensing patterns 540 can be disposed in one line along the bending direction of the bending area BA. That is, the plurality of bending sensing patterns 540 can be disposed in different areas of the plurality of sub bending areas SBA1, SBA2, and SBA3. In this instance, the plurality of bending sensing patterns 540 can be disposed to be aligned in one line in a direction parallel to the bending direction of the bending area BA. Specifically, the plurality of bending sensing patterns 540 can include a first bending sensing pattern 541, a second bending sensing pattern 542, and a third bending sensing pattern 543. Specifically, the first bending sensing pattern 541, the second bending sensing pattern 542, and the third bending sensing pattern 543 can be disposed in the first sub bending area SBA1, the second sub bending area SBA2, and the third sub bending area SBA3, respectively. In this instance, the first bending sensing pattern 541, the second bending sensing pattern 542, and the third bending sensing pattern 543 can be sequentially disposed in one line in a direction parallel to the bending direction of the bending area BA. Therefore, in the display device 500 according to another example embodiment of the present disclosure, a size of the bending area BA in which the plurality of bending sensing patterns 540 can be disposed can be reduced. That is, a size of the bending area BA in which the plurality of bending sensing patterns 540 can be disposed can be further reduced. Therefore, an area in which other components of the display device 500 can be disposed can be increased so that a space in the display device 500 can be more efficiently utilized and a width of the bezel can be reduced. Accordingly, the plurality of bending sensing patterns 540 can be nested within another thereof, or can be superimposed, but without directly intersecting.

Figure 6A:
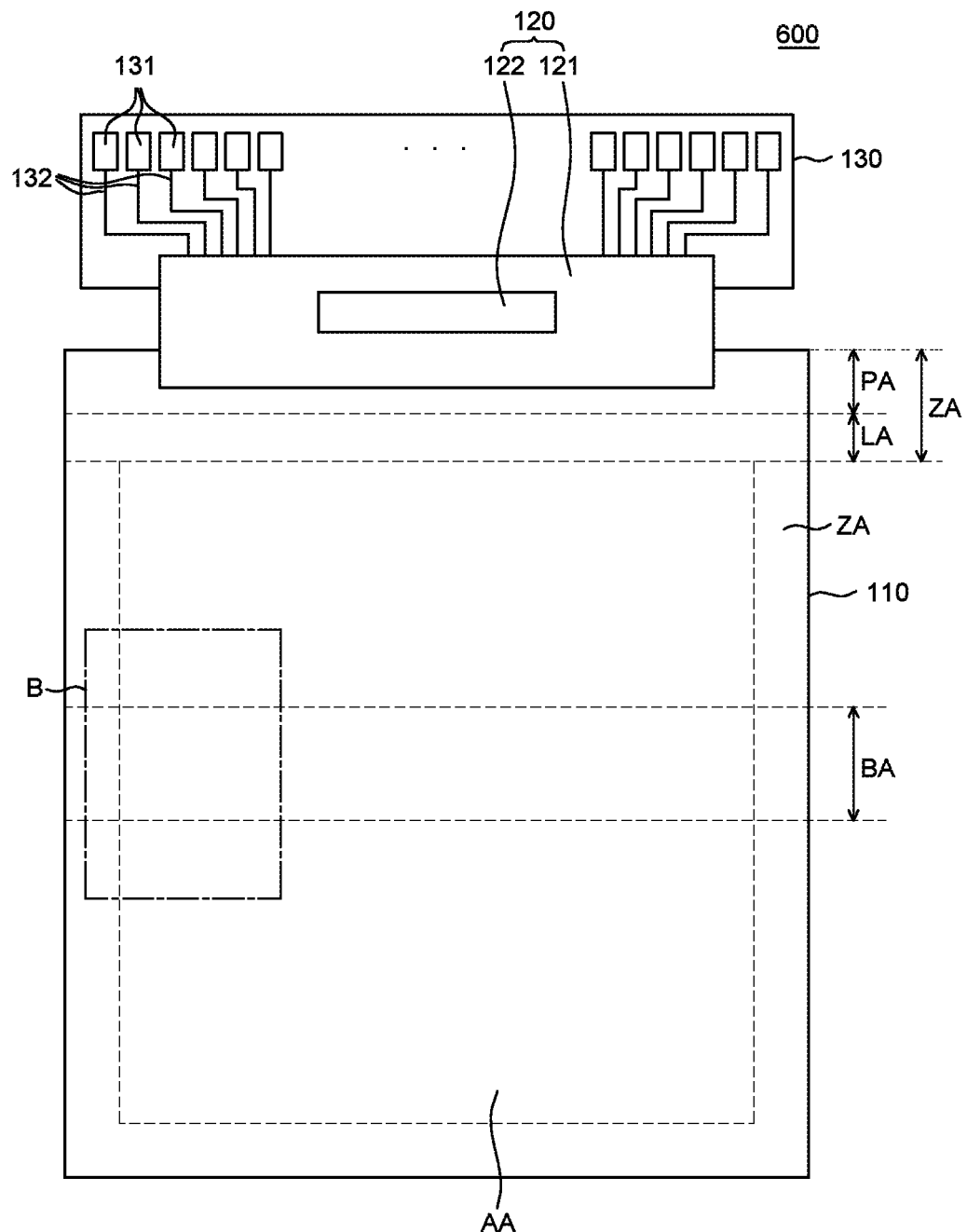
FIG. 6A is a schematic plan view of a display device according to still another example embodiment of the present disclosure.
Figure 6B:
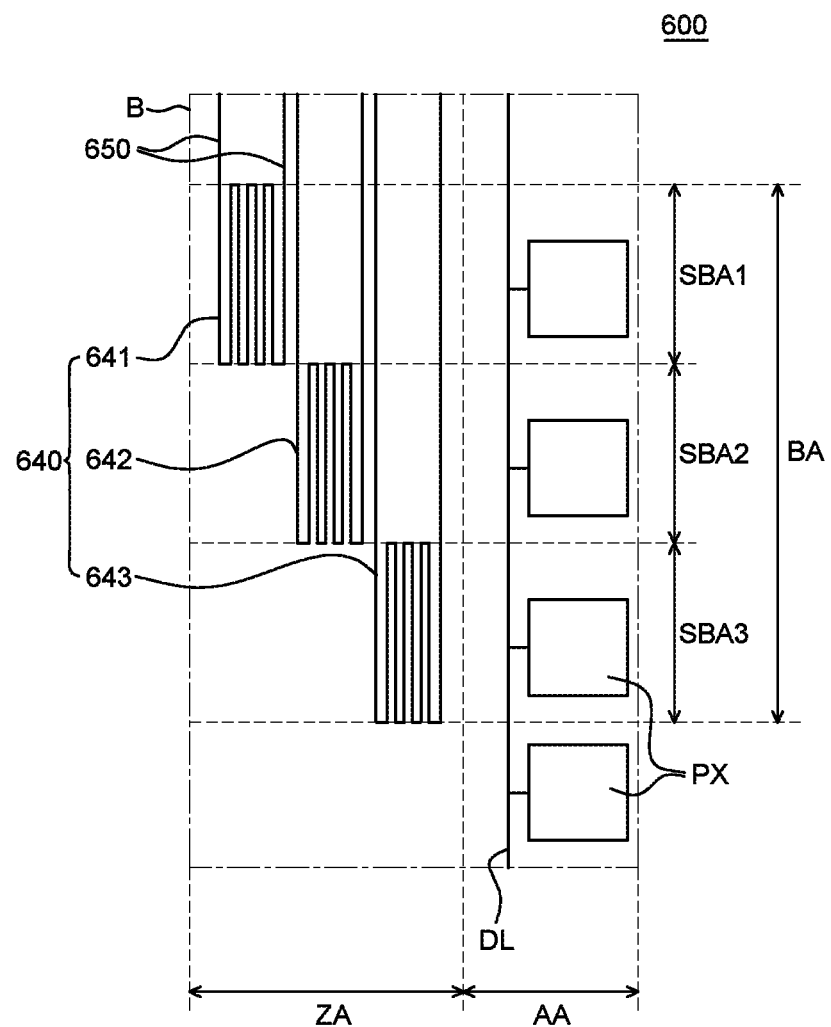
FIG. 6B is an enlarged plan view of a B part of the display device according to another example embodiment of the present disclosure illustrated in FIG. 6A.

FIG. 6A is a schematic plan view of a display device according to still another example embodiment of the present disclosure. FIG. 6B is an enlarged plan view of a B part of a display device 600 according to another example embodiment of the present disclosure illustrated in FIG. 6A. A display device 600 illustrated in FIGS. 6A and 6B can be substantially the same as the display device 100 illustrated in FIGS. 1 to 5 except that the position of the bending area BA can be different so that a redundant description will be omitted.

Referring to FIGS. 6A and 6B, a bending area BA of the display device 600 can be defined in a partial area (or a portion) of an active area AA and on both sides of the partial area. That is, the partial area of the active area AA and the bezel area ZA disposed on both sides of the partial area can be defined as a bending area BA to be bent. In this instance, the plurality of bending sensing patterns 640 can be disposed in the bending area BA defined on both sides of the partial area of the active area AA. The bending area BA can include a plurality of sub bending areas SBA1, SBA2, and SBA3. Specifically, the bending area BA can include a first sub bending area SBA1, a second sub bending area SBA2, and a third sub bending area SBA3. However, the number of sub bending areas is not limited to the number illustrated in FIG. 6B.

The plurality of bending sensing patterns 640 can be disposed in different areas of the plurality of sub bending areas SBA1, SBA2, and SBA3. That is, the first bending sensing pattern 641 can be disposed in the first sub bending area SBA1, the second bending sensing pattern 642 can be disposed in the second sub bending area SBA2, and the third bending sensing pattern 643 can be disposed in the third sub bending area SBA3. The plurality of bending sensing patterns 640 can be disposed in a diagonal direction with respect to the bending direction of the bending area BA as illustrated in FIGS. 6A and 6B, but is not limited thereto. Similarly to the arrangement of the plurality of bending sensing patterns 540 illustrated in FIG. 5, the plurality of bending sensing patterns can be disposed in one line along the bending direction. When the plurality of bending sensing patterns 640 can be disposed in one line along the bending direction, the size of the bending area BA can be reduced and thus a width of the bezel area ZA corresponding to the bending area BA can be reduced. In this instance, the plurality of bending sensing patterns 640 can be connected to bending sensing lines 650. The bending sensing lines 650 can connect the plurality of bending sensing patterns 640 and the pads P to each other.

In the display device 600 according to still another example embodiment of the present disclosure, the bending area BA can be defined in a partial area of the active area AA and on both sides of the partial area. Therefore, even when the active area AA is bent, the bending degree can be sensed. When the bending area BA is bent, the resistances of the plurality of bending sensing patterns 640 can be changed. For example, as a bending angle is increased, the resistances of the plurality of bending sensing patterns 640 can be increased. In this instance, the plurality of bending sensing patterns 640 can be disposed in the plurality of sub bending areas SBA1, SBA2, and SBA3, respectively, so that stresses applied to the elements of the active area AA disposed in each of the plurality of sub bending areas SBA1, SBA2, and SBA3 can be independently sensed. Therefore, the plurality of bending sensing patterns 640 senses the stress applied to the active area AA corresponding to the bending area BA for every sub bending area, so that the bending angle of the display device 600 can be more precisely measured. Therefore, in the display device 600 according to still another example embodiment of the present disclosure, the bending angle of the bending area BA defined in the active area AA can be more precisely measured. Further, the display device 600 can correct an image to be displayed to a user in accordance with the measured angle.

Figure 7A:
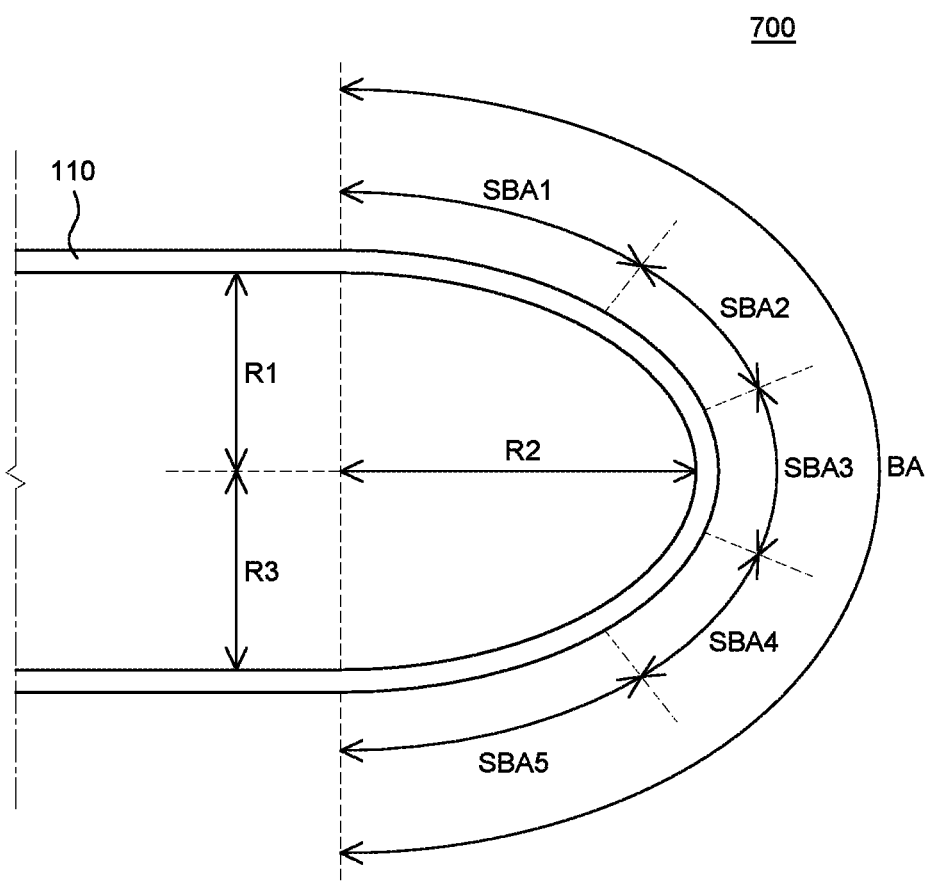
FIG. 7A is a cross-sectional view of a display device according to still another example embodiment of the present disclosure which is bent.
Figure 7B:
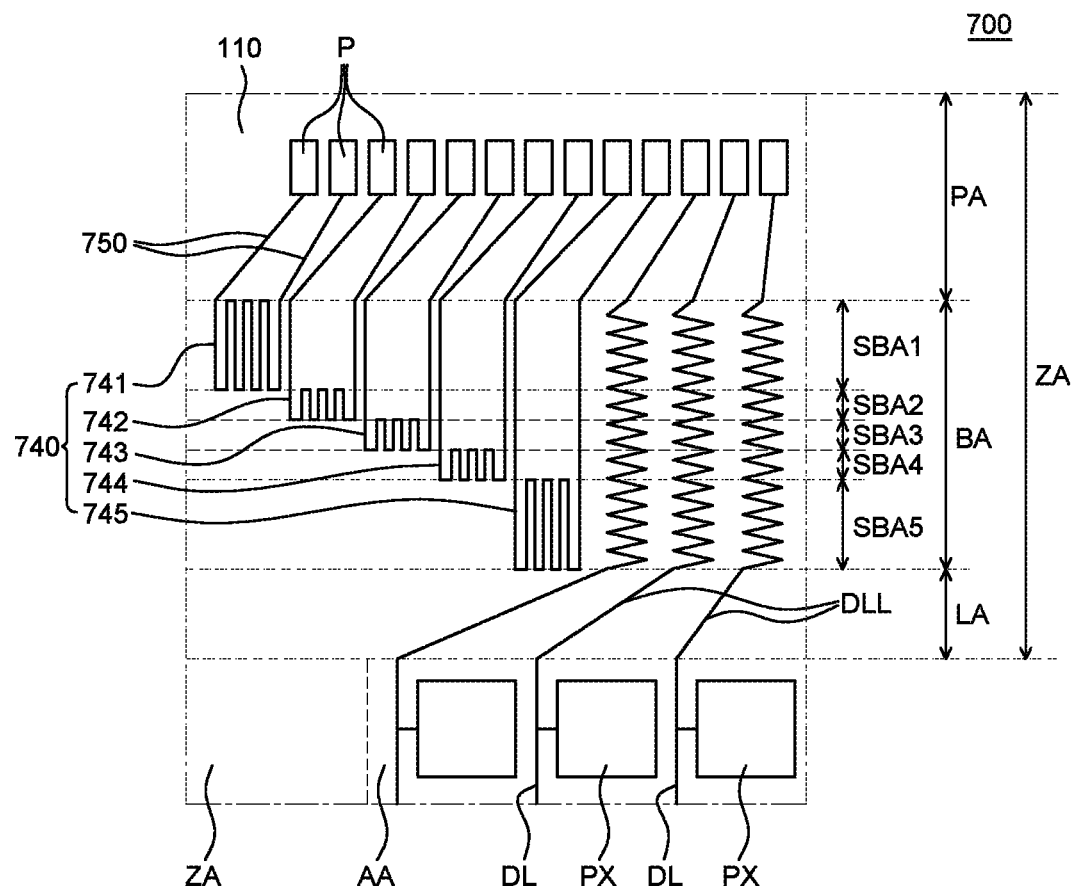
FIG. 7B is an enlarged cross-sectional view of a part of a bending area of a display device according to still another example embodiment of the present disclosure.

FIG. 7A is a cross-sectional view of a display device according to still another example embodiment of the present disclosure which is bent. FIG. 7B is an enlarged cross-sectional view of a part of a bending area of a display device according to still another example embodiment of the present disclosure. A display device 700 illustrated in FIGS. 7A and 7B can be substantially the same as the display device 100 illustrated in FIGS. 1 to 4 except that widths in the bending direction of the plurality of sub bending areas SBA1, SBA2, SBA3, SBA4, and SBA5 and the plurality of bending sensing patterns 740 can be different so that a redundant description will be omitted.

Referring to FIG. 7A, widths in the bending direction of the plurality of sub bending areas SBA1, SBA2, SBA3, SBA4, and SBA5 included in the bending area BA of the flexible substrate 110 can be different from each other. That is, at least some of the plurality of sub bending areas SBA1, SBA2, SBA3, SBA4, and SBA5 can have different widths. Specifically, widths of some sub bending areas among the plurality of sub bending areas SBA1, SBA2, SBA3, SBA4, and SBA5 can be smaller or larger than that of the other sub bending areas. As illustrated in FIG. 7A, the bending area BA includes a first sub bending area SBA1, a second sub bending area SBA2, a third sub bending area SBA3, a fourth sub bending area SBA4, and a fifth sub bending area SBA5. Further, the widths in the bending direction of the first sub bending area SBA1 and the fifth sub bending area SBA5 can be larger than the widths in the bending direction of the second sub bending area SBA2, the third sub bending area SBA3, and the fourth sub bending area SBA4.

The plurality of sub bending areas SBA1, SBA2, SBA3, SBA4, and SBA5 included in the bending area BA of the flexible substrate 110 can have different radius of curvature. That is, some of the plurality of sub bending areas SBA1, SBA2, SBA3, SBA4, and SBA5 can have different radius of curvature. Even though all the plurality of sub bending areas SBA1, SBA2, SBA3, SBA4, and SBA5 can be designed to have the same radius of curvature depending on the design of the display device 700, the plurality of sub bending areas SBA1, SBA2, SBA3, SBA4, and SBA5 can have different radius of curvature due to a process error. Alternatively, the display device 700 can be designed such that the plurality of sub bending areas SBA1, SBA2, SBA3, SBA4, and SBA5 has different radius of curvature. Therefore, the bending area BA can be bent such that a cross-section of the bending area BA has a shape of a part of a circle, but as illustrated in FIG. 7A, the bending area BA can be bent to have a shape of a part of an oval. For example, when the bending area BA of the flexible substrate 110 can be bent as illustrated in FIG. 7A, the radius of curvature of the third sub bending area SBA3 can be smaller than the radius of curvature of other sub bending area SBA1, SBA2, SBA4 and SBA5. Therefore, the radius of curvature of the bending area BA can be reduced and then increased in the bending area BA. In this instance, a width in the bending direction of a sub bending area having a relatively small radius of curvature among the plurality of sub bending areas SBA1, SBA2, SBA3, SBA4, and SBA5 can be smaller than a width in the bending direction of a sub bending area having a relatively large radius of curvature.

Specifically, the radius of curvature of the second sub bending area SBA2, the third sub bending area SBA3, and the fourth sub bending area SBA4 can be smaller than the radius of curvature of the first sub bending area SBA1 and the fifth sub bending area SBA5, among the plurality of sub bending areas SBA1, SBA2, SBA3, SBA4, and SBA5. Thus, the widths in the bending direction of the second sub bending area SBA2, the third sub bending area SBA3, and the fourth sub bending area SBA4 can be smaller than the widths in the bending direction of the first sub bending area SBA1 and the fifth sub bending area SBA5.

Referring to FIG. 7B, the plurality of bending sensing patterns 740 can be disposed in different areas of the plurality of sub bending areas SBA1, SBA2, SBA3, SBA4, and SBA5. The first bending sensing pattern 741 can be disposed in the first sub bending area SBA1 and the second bending sensing pattern 742 can be disposed in the second sub bending area SBA2. Further, the third bending sensing pattern 743 can be disposed in the third sub bending area SBA3, the fourth bending sensing pattern 744 can be disposed in the fourth sub bending area SBA4, and the fifth bending sensing pattern 745 can be disposed in the fifth sub bending area SBA5. The plurality of bending sensing patterns 740 can be connected to the bending sensing lines 750.

The bending sensing lines 750 can connect the plurality of bending sensing patterns 740 to the pads P.

Further, at least some of the plurality of bending sensing patterns 740 can have different widths in the bending direction of the bending area BA. That is, the widths in the bending direction of the first bending sensing pattern 741 and the fifth bending sensing pattern 745 can be larger than the widths in the bending direction of the second bending sensing pattern 742, the third bending sensing pattern 743, and the fourth bending sensing pattern 744. Therefore, for example, among the plurality of bending sensing patterns 740, the first bending sensing pattern 741 and the second bending sensing pattern 742 can have different widths in the bending direction of the bending area BA. That is, the width in the bending direction of the first bending sensing pattern 741 can be larger than the width in the bending direction of the second bending sensing pattern 742.

The display device 700 according to another example embodiment of the present disclosure makes a width in the bending direction of some of the plurality of sub bending areas SBA1, SBA2, SBA3, SBA4, and SBA5 different from a width in the bending direction of the other sub bending areas to adjust the width of the sub bending area as needed. For example, a bending degree of a specific area of the bending area BA needs to be more precisely identified. A bending degree of some areas of the bending areas BA can be larger than that of other areas. Therefore, several bending sensing patterns can be disposed in some areas having a relatively large bending degree to more precisely sense the bending degree. Further, damages such as cracks can be precisely sensed by setting the width in the bending direction of the sub bending area having a relatively small radius of curvature among the bending areas to be small and setting the width in the bending direction of the sub bending area having a relatively large radius of curvature to be large. In the sub bending area having a small radius of curvature, as compared with the sub bending area having a large radius of curvature, there can be a high probability that cracks occur in the thin film transistor 160 or several wiring lines disposed on the substrate according to the bending of the flexible substrate 110. In this instance, when a width in the bending direction of the sub bending area having a small radius of curvature can be relatively reduced, a density of a sub bending area included in an area having a small radius of curvature among the bending areas BA can be increased. Therefore, an increased number of bending patterns can be disposed in an area having a small radius of curvature than an area having a large radius of curvature between two areas having the same size so that the bending can be more precisely sensed. For example, when several bending sensing patterns having a small width can be disposed in some areas of the bending areas BA having a small radius of curvature, a position where the crack is generated due to the bending can be more accurately determined. Therefore, a position where an error is incurred during the bending process of the display device 700 can be clearly identified and thus the process can be quickly changed.

Figure 8:
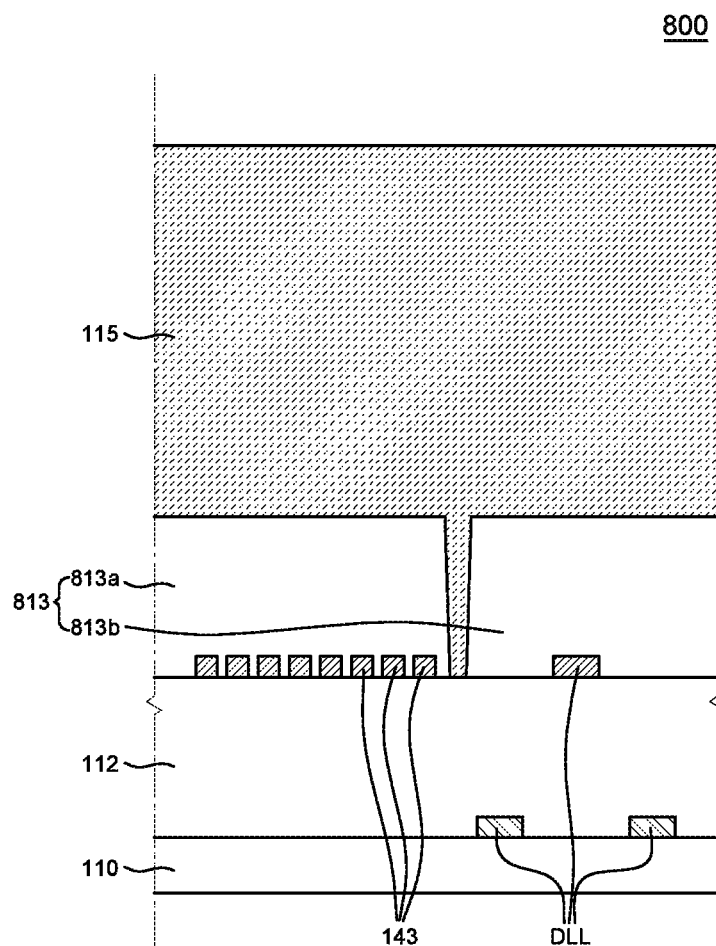
FIG. 8 is a schematic cross-sectional view of a part of a bending area of a display device according to still another example embodiment of the present disclosure.

FIG. 8 is a schematic cross-sectional view of a part of a bending area of a display device according to still another example embodiment of the present disclosure. The cross-sectional view illustrated in FIG. 8 is a cross-sectional view taken along the line IIIa-IIIa' of FIG. 3. A display device 800 illustrated in FIG. 8 can be substantially the same as the display device 100 illustrated in FIGS. 1 to 4 except that the second planarization layer 813 has a different structure so that a redundant description will be omitted.

Referring to FIG. 8, a second planarization layer 813 includes a first planarization pattern 813a and a second planarization pattern 813b. The first planarization pattern 813a can be a pattern which covers the plurality of bending sensing patterns 140 including the third bending sensing pattern 143, and the second planarization pattern 813b can be a pattern which covers the data link line DLL disposed on the same layer as the third bending sensing pattern 143. Therefore, the second planarization layer 813 can be divided into the first planarization pattern 813a which can be a planarization layer covering the plurality of bending sensing patterns 140 and the second planarization pattern 813b which covers the wiring lines disposed on the same layer as the plurality of bending sensing patterns 140. The first planarization pattern 813a and the second planarization pattern 813b can be disposed to be spaced apart from each other. That is, the second planarization layer 813 which can be disposed to cover the plurality of bending sensing patterns 140 can be divided into the first planarization pattern 813a which covers the plurality of bending sensing patterns 140 and the second planarization pattern 813b which covers the wiring lines disposed on the same layer as the plurality of bending sensing patterns 140.

In the display device 800 according to another example embodiment of the present disclosure, the second planarization layer 813 includes the first planarization pattern 813a which covers the plurality of bending sensing patterns 140 and the second planarization pattern 813b which covers the wiring lines disposed on the same layer as the plurality of bending sensing patterns 140. Therefore, propagation of cracks to the wiring line covered by the second planarization pattern 813b can be reduced. Specifically, as described above, in order to more accurately measure resistance in a broader range, the plurality of bending sensing patterns 140 can have a pattern extending in a direction parallel to the bending direction. However, when the bending area BA is bent, more stress can be applied to the patterns extending in a direction parallel to the bending direction than a pattern extending in different directions. Therefore, as the display device 800 is bent, the data link lines DLL may not be cracked, but the plurality of bending sensing patterns 140 can be cracked. Further, the crack generated in the plurality of bending sensing patterns 140 can propagate to the data link lines DLL through the second planarization layer 813. Therefore, in the display device 800 according to another example embodiment of the present disclosure, a part of the second planarization layer 813 which covers the plurality of bending sensing patterns 140 and a part of the second planarization layer 813 which covers the plurality of data link lines DLL can be separated from each other. Accordingly, the propagation of the crack generated in the plurality of bending sensing patterns 140 to the plurality of data link lines DLL can be reduced.

Figure 9A:
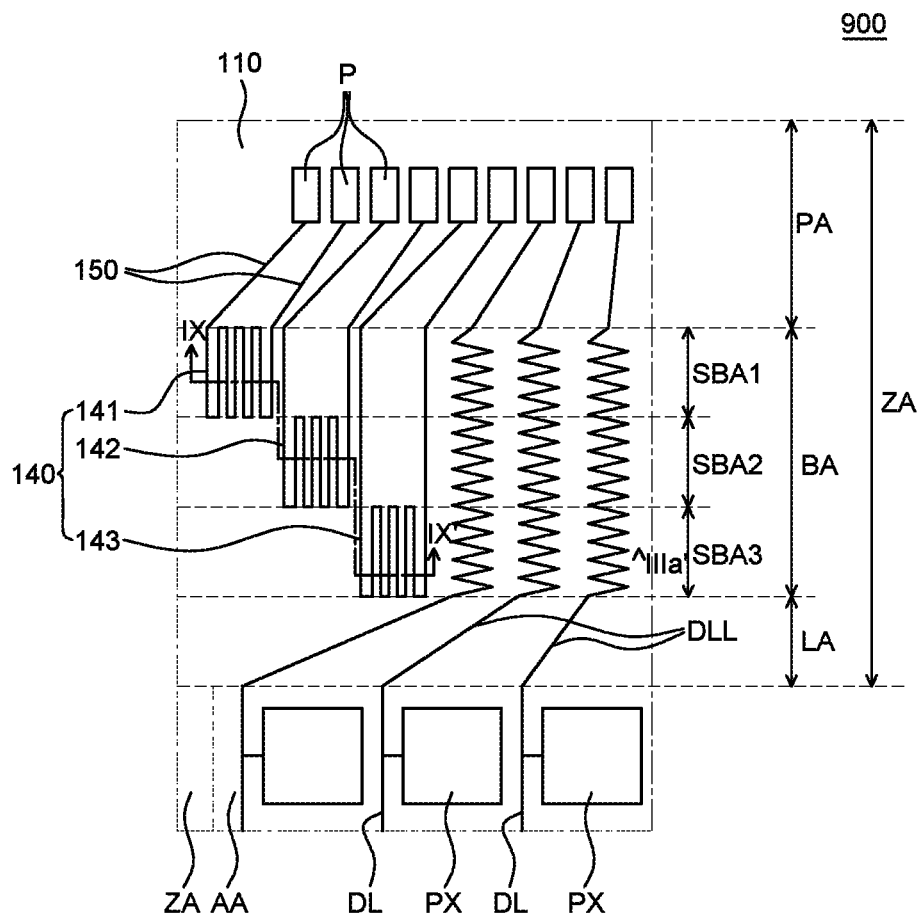
FIG. 9A is an enlarged plan view of a part of a bending area of a display device according to another example embodiment of the present disclosure.
Figure 9B:
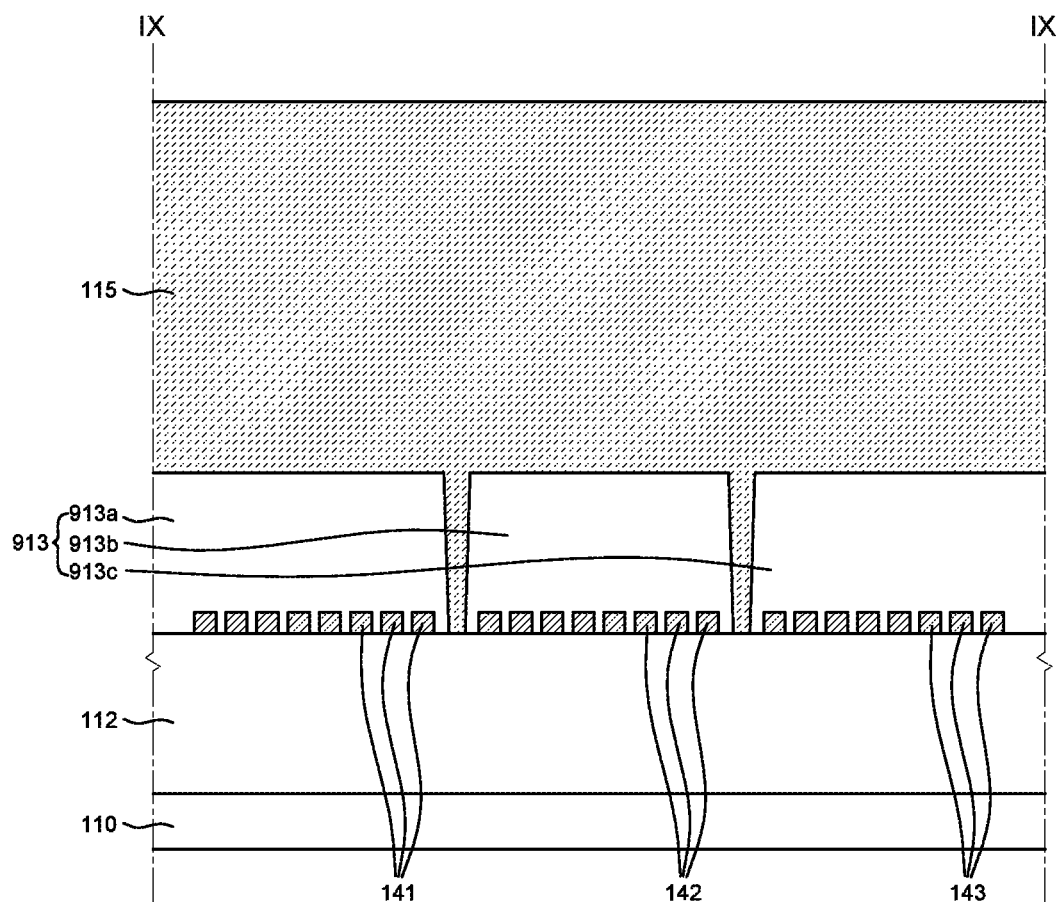
FIG. 9B is a schematic cross-sectional view taken along IX-IX' of FIG. 9A.

FIG. 9A is an enlarged plan view of a part of a bending area of a display device according to another example embodiment of the present disclosure. FIG. 9B is a cross-sectional view taken along IX-IX' of FIG. 9A. A display device 900 illustrated in FIGS. 9A and 9B can be substantially the same as the display device 100 illustrated in FIGS. 1 to 4 except that the second planarization layer 913 has a different structure so that a redundant description will be omitted.

Referring to FIGS. 9A and 9B, a second planarization layer 913 can be divided into a plurality of planarization patterns which can be spaced apart from each other and covers the plurality of bending sensing patterns 140. Specifically, the second planarization layer 913 includes a first planarization pattern 913a, a second planarization pattern 913b, and a third planarization pattern 913c. The first planarization pattern 913a can be a planarization layer which covers the first bending sensing pattern 141, the second planarization pattern 913b can be a planarization layer which covers the second bending sensing pattern 142, and the third planarization pattern 913c can be a planarization layer which covers the third bending sensing pattern 143.

The display device 900 according to another example embodiment of the present disclosure forms the second planarization layer 913 to be divided into a plurality of planarization patterns which can be spaced apart from each other and covers each of the plurality of bending sensing patterns 140. Therefore, the propagation of the crack generated in one pattern of the plurality of bending sensing patterns 140 can be reduced. Specifically, as the display device 900 is bent, some of the plurality of bending sensing patterns 140 can be cracked. The plurality of sub bending areas SBA1, SBA2, and SBA3 in which the plurality of bending sensing patterns 140 can be located can have different bending radius and a larger stress can be applied to a bending sensing pattern disposed in a sub bending area having a large bending radius than a bending sensing pattern disposed in a sub bending area having a small bending radius. Therefore, the bending sensing pattern disposed in a sub bending area having a large bending radius can be more likely to be cracked. Further, the crack generated in some bending sensing patterns can propagate to the other bending sensing patterns or the data link lines DLL through the second planarization layer 913. When the crack generated in some bending sensing patterns propagates to other bending sensing patterns, resistance of the bending sensing pattern to which the crack propagates can be significantly increased so that it can be measured that the crack is generated. Therefore, there can be a problem in that the bending sensing pattern to which the crack propagates can be measured as a bending sensing pattern which is cracked. Therefore, in the display device 900 according to another example embodiment of the present disclosure, the second planarization layer 913 which covers the plurality of bending sensing patterns 140 can be separated to cover each of the plurality of bending patterns 140. Therefore, the propagation of the crack generated in some patterns of the plurality of bending sensing patterns 140 to other bending sensing patterns can be reduced. Therefore, the sub bending area in which the cracked bending sensing pattern is disposed can be accurately determined.

Figure 10:
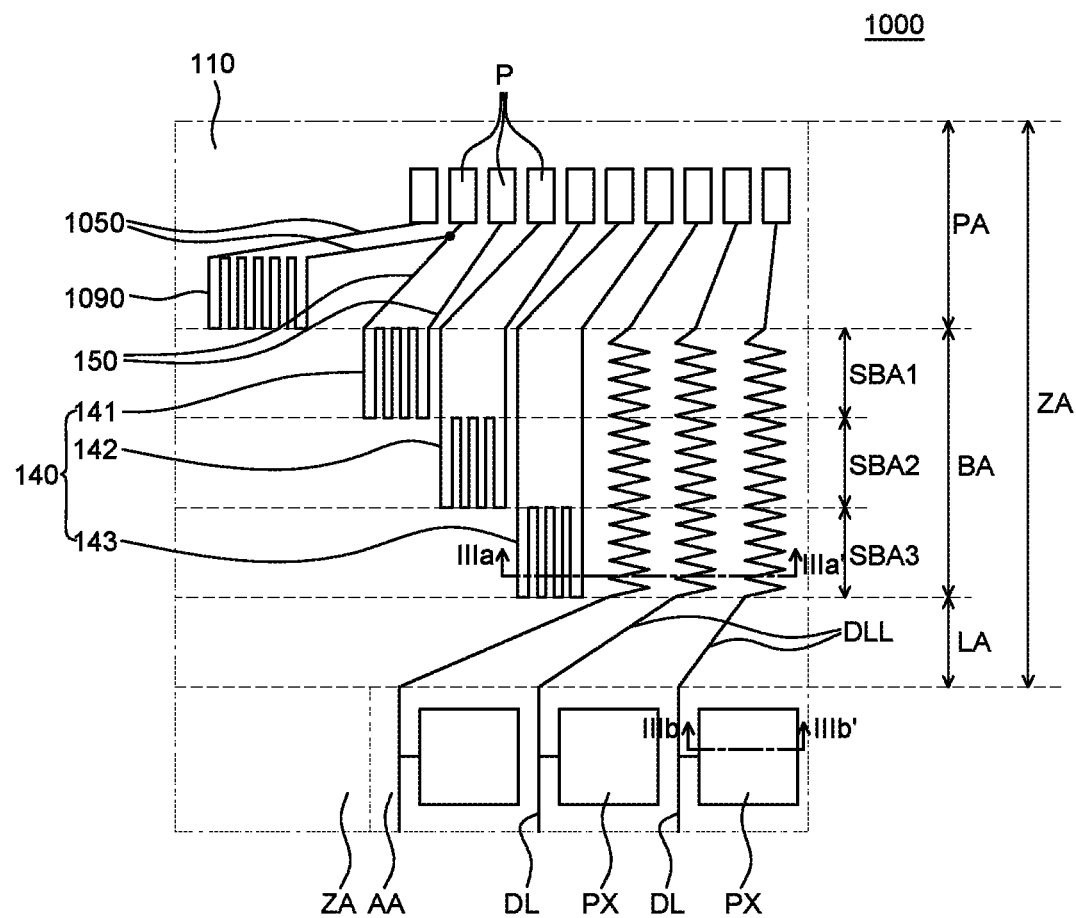
FIG. 10 is an enlarged plan view of a display device according to another example embodiment of the present disclosure.

FIG. 10 is an enlarged plan view of a display device according to another example embodiment of the present disclosure. A display device 1000 illustrated in FIG. 10 can be substantially the same as the display device 100 illustrated in FIGS. 1 to 4 except that a resistance sensing pattern 1090 for a temperature can be included so that a redundant description will be omitted.

Referring to FIG. 10, the display device 1000 includes a resistance sensing pattern 1090 for a temperature which senses a resistance of a pattern varying in accordance with a change of a temperature of the display device 1000. The resistance sensing pattern 1090 for a temperature can be located in the pad area PA, but is not limited thereto. The resistance sensing pattern 1090 for a temperature can be disposed in an area which is not bent, that is, in an arbitrary area excluding the bending area BA. For example, the resistance sensing pattern 1090 for a temperature can be disposed in the link area LA or a bezel area ZA located on both sides of the active area AA.

When a temperature of the display device 1000 is very high or very low, elements included in the display device 1000 can be damaged. Therefore, in the display device 1000 according to another example embodiment of the present disclosure, a change of the resistance of the resistance sensing pattern 1090 for a temperature can be measured to sense the damage of the element due to the temperature.

Referring to FIG. 10, the resistance sensing pattern 1090 for a temperature can share the pad P with one of the plurality of bending sensing patterns 140. For example, a resistance sensing line connected to one end of the resistance sensing pattern 1090 for a temperature can be connected to the bending sensing line 1050 connected to one end of the first bending sensing pattern 141 to be connected to the same pad P. Since jobs for measuring a resistance of the resistance sensing pattern 1090 for a temperature and a resistance of the first bending sensing pattern 141 can be separately performed, even though the resistance sensing pattern 1090 for a temperature and the first bending sensing pattern 141 share the pad P with each other, there is no problem to measure the resistance. Therefore, in the display device 1000 according to another example embodiment of the present disclosure, the resistance sensing pattern 1090 for a temperature shares the pad P with one of the plurality of bending sensing patterns 140, so that the number of pads P can be reduced and the size of the bezel area ZA can be reduced.

Further, even though not illustrated in FIG. 10, the plurality of bending sensing patterns 140 shares the pad P with each other, the number of pads P can be reduced and the size of the bezel area ZA can be reduced.

Figure 11:
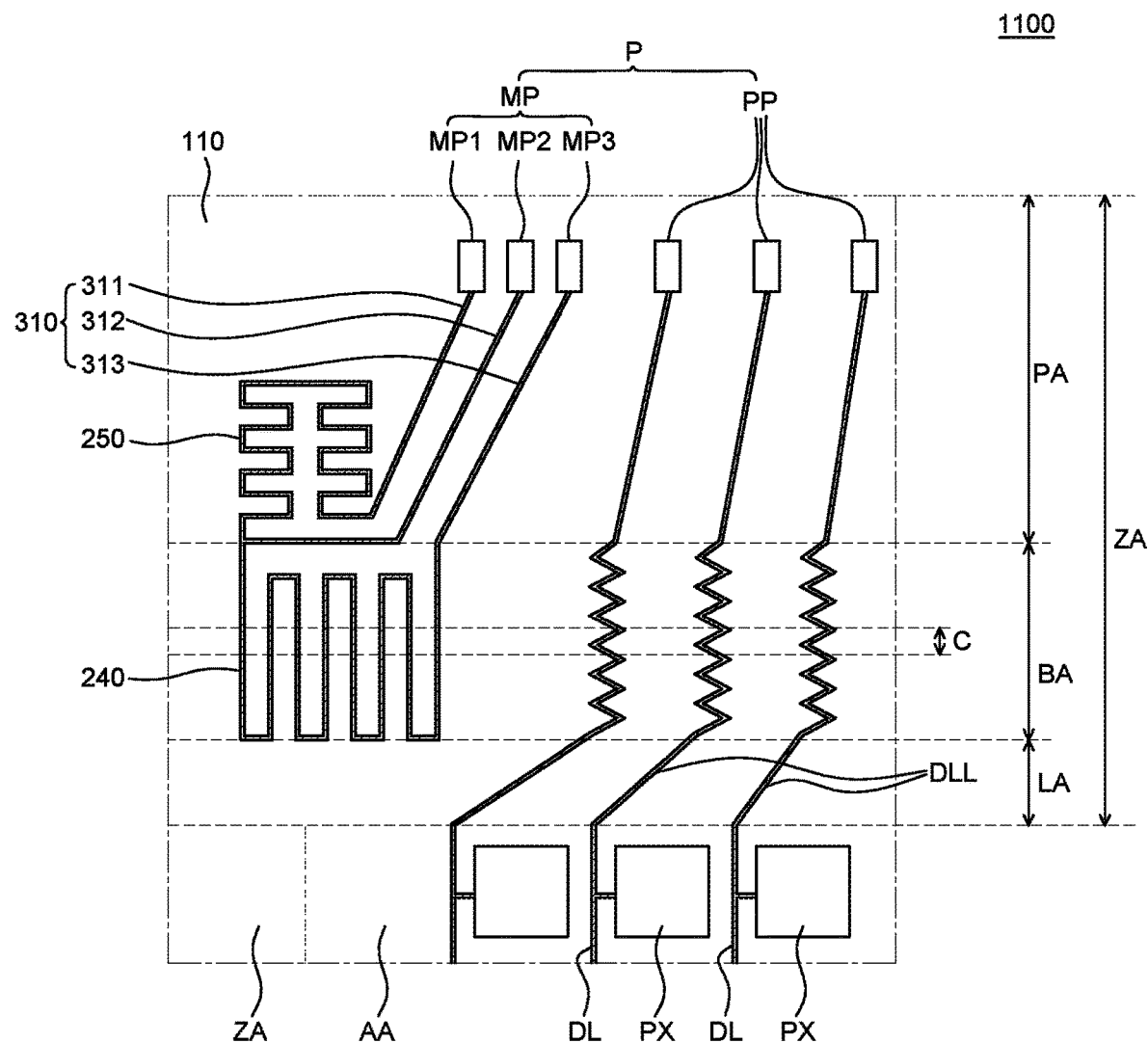
FIG. 11 is an enlarged plan view of a part of a bending area of a display device according to another example embodiment of the present disclosure.

FIG. 11 is an enlarged plan view of a display device according to another example embodiment of the present disclosure in which a display device 1100 in which a COF 120 has not been bonded is illustrated for the convenience of description.

The display device 1100 illustrated in FIG. 11 can be substantially the same as the display device 100 illustrated in FIGS. 1 to 4 except for a temperature monitoring pattern 250 and a bending monitoring pattern 240. Therefore, in the description for FIG. 11, a detailed description of the components other than the temperature monitoring pattern 250 and the bending monitoring pattern 240 may be omitted or briefly made.

Referring to FIG. 11, the display device 1100 can include an active area AA in which images can be displayed and a display element and various driving elements for driving the display element can be disposed and a bezel area ZA in which images are not displayed and wiring lines or circuit units can be disposed. The bezel area ZA can include a bending area BA, a link area LA, and a pad area PA. The active area AA can include a plurality of pixels PX connected to data lines DL through which a data signal can be transmitted. The data lines DL can be electrically connected to data link lines DLL. The data link lines DLL which can be electrically connected to the data lines DL can be disposed in the link area LA, the bending area BA, and the pad area PA to electrically connect the pad P in the pad area PA to the data lines DL in the active area AA.

The bending area BA refers to an area where the flexible substrate 110 is bent. The bending area BA can be disposed to be adjacent to one side of the link area LA. The link area LA can be located between the active area AA and the bending area BA.

The pad area PA refers to an area in which a plurality of pads P can be formed. The pad area PA can be disposed to be adjacent to one side of the bending area BA. The bending area BA can be located between the pad area PA and the link area LA.

As the flexible substrate 110 is bent, the data link line DLL can be formed to have various shapes such as a zigzag pattern or a rhombus shape to reduce a damage caused in the data link line DLL of the bending area BA of the flexible substrate 110. For example, as illustrated in FIG. 11, in order to suppress the crack generated in the data link line DLL corresponding to the bending area BA of the display device 1100, the data link line DLL can be formed to have a zigzag pattern. The zigzag pattern can be formed in the data link line DLL located in an area corresponding to the bending area BA, of the data link line DLL formed in the bezel area ZA.

Referring to FIG. 11, the display device 1100 can include a bending monitoring pattern 240 disposed in the bending area BA and a temperature monitoring pattern 250 disposed in the pad area PA. The bending monitoring pattern 240 can be a pattern for monitoring a degree to which the bending area BA of the display device 1100 is bent. The temperature monitoring pattern 250 can be a pattern for monitoring a resistance of a pattern which varies depending on a temperature change of the display device 1100. The temperature monitoring pattern 250 can be disposed in an area excluding the bending area BA. For example, the temperature monitoring pattern 250 can be disposed in the link area LA or a bezel area ZA located on both sides of the active area AA.

The resistance of the bending monitoring pattern 240 can vary depending on the degree to which the bending area BA is bent. A resistance of the bending monitoring pattern 240 which is changed after being bent can be measured as compared with an initial resistance of the bending monitoring pattern 240 before being bent to monitor a degree to which the display device 1100 is bent.

The bending monitoring pattern 240 can be configured to detect a stress in the bending area BA generated as the bending area BA of the bezel area ZA is bent.

When a temperature of the display device 1100 is very high or very low, elements included in the display device 1100 can be damaged. Therefore, in the display device 1100 according to the example embodiment of the present disclosure, a change of the resistance of the temperature monitoring pattern 250 can be measured to sense the damage of the element due to the temperature.

Referring to FIG. 11, the plurality of pads P can include a plurality of monitoring pads MP and a plurality of pixel pads PP. The plurality of monitoring pads MP can be electrically connected to the temperature monitoring pattern 250 or the bending monitoring pattern 240 through a connection line 310. Further, the plurality of pixel pads PP can be electrically connected to the plurality of pixels PX of the active area AA through the plurality of data link lines DLL.

The temperature monitoring pattern 250 and the bending monitoring pattern 240 can share one of the plurality of monitoring pads MP. For example, as illustrated in FIG. 11, the temperature monitoring pattern 250 disposed in the pad area PA of the display device 1100 can be electrically connected to a first monitoring pad MP1 and a second monitoring pad MP2 among the plurality of monitoring pads MP. Further, the bending monitoring pattern 240 disposed in the bending area BA of the display device 1100 can be electrically connected to the second monitoring pad MP2 and a third monitoring pad MP3 among the plurality of monitoring pads MP. The temperature monitoring pattern 250 and the bending monitoring pattern 240 can share the second monitoring pads MP2.

One end of the temperature monitoring pattern 250 can be electrically connected to the first monitoring pad MP1. The other end of the temperature monitoring pattern 250 can be electrically connected to the second monitoring pad MP2. One end of the bending monitoring pattern 240 can be electrically connected to the third monitoring pad MP3. The other end of the bending monitoring pattern 240 can be electrically connected to the second monitoring pad MP2. The other end of the temperature monitoring pattern 250 and the other end of the bending monitoring pattern 240 can be connected to the second monitoring pad MP2.

The bending monitoring pattern 240 can be connected to the connection line 310. The connection line 310 can be connected to the pad P. The connection line 310 can be a line through which the bending monitoring pattern 240 and the pad P can be electrically connected. Further, the temperature monitoring pattern 250 can be connected to the connection line 310. The connection line 310 can be a line through which the temperature monitoring pattern 250 and the pad P can be electrically connected.

The connection line 310 can include a first connection line 311, a second connection line 312, and a third connection line 313. The first connection line 311 can electrically connect the temperature monitoring pattern 250 and the first monitoring pad MP1. The second connection line 312 can electrically connect the temperature monitoring pattern 250 and the second monitoring pad MP2. The second connection line 312 can electrically connect the bending monitoring pattern 240 and the second monitoring pad MP2. The bending monitoring pattern 240 and the temperature monitoring pattern 250 can share the second connection line 312. The third connection line 313 can electrically connect the bending monitoring pattern 240 and the third monitoring pad MP3.

One end of the temperature monitoring pattern 250 can be electrically connected to the first monitoring pad MP1 through the first connection line 311. The other end of the temperature monitoring pattern 250 can be electrically connected to the second monitoring pad MP2 through the second connection line 312. One end of the bending monitoring pattern 240 can be electrically connected to the third monitoring pad MP3 through the third connection line 313. The other end of the bending monitoring pattern 250 can be electrically connected to the second monitoring pad MP2 through the second connection line 312. The other end of the temperature monitoring pattern 250 and the other end of the bending monitoring pattern 240 can share the second connection line 312. The other end of the temperature monitoring pattern 250 and the other end of the bending monitoring pattern 240 can be electrically connected to the second monitoring pad MP2 through the second connection line 312.

The change of the resistance of the temperature monitoring pattern 250 can be measured by means of the first monitoring pad MP1 and the second monitoring pad MP2 to monitor the change of the temperature. Further, the change of the resistance of the bending monitoring pattern 240 can be measured by means of the second monitoring pad MP2 and the third monitoring pad MP3 to monitor a degree to which the bending area BA of the display device 1100 is bent.

Figure 12:
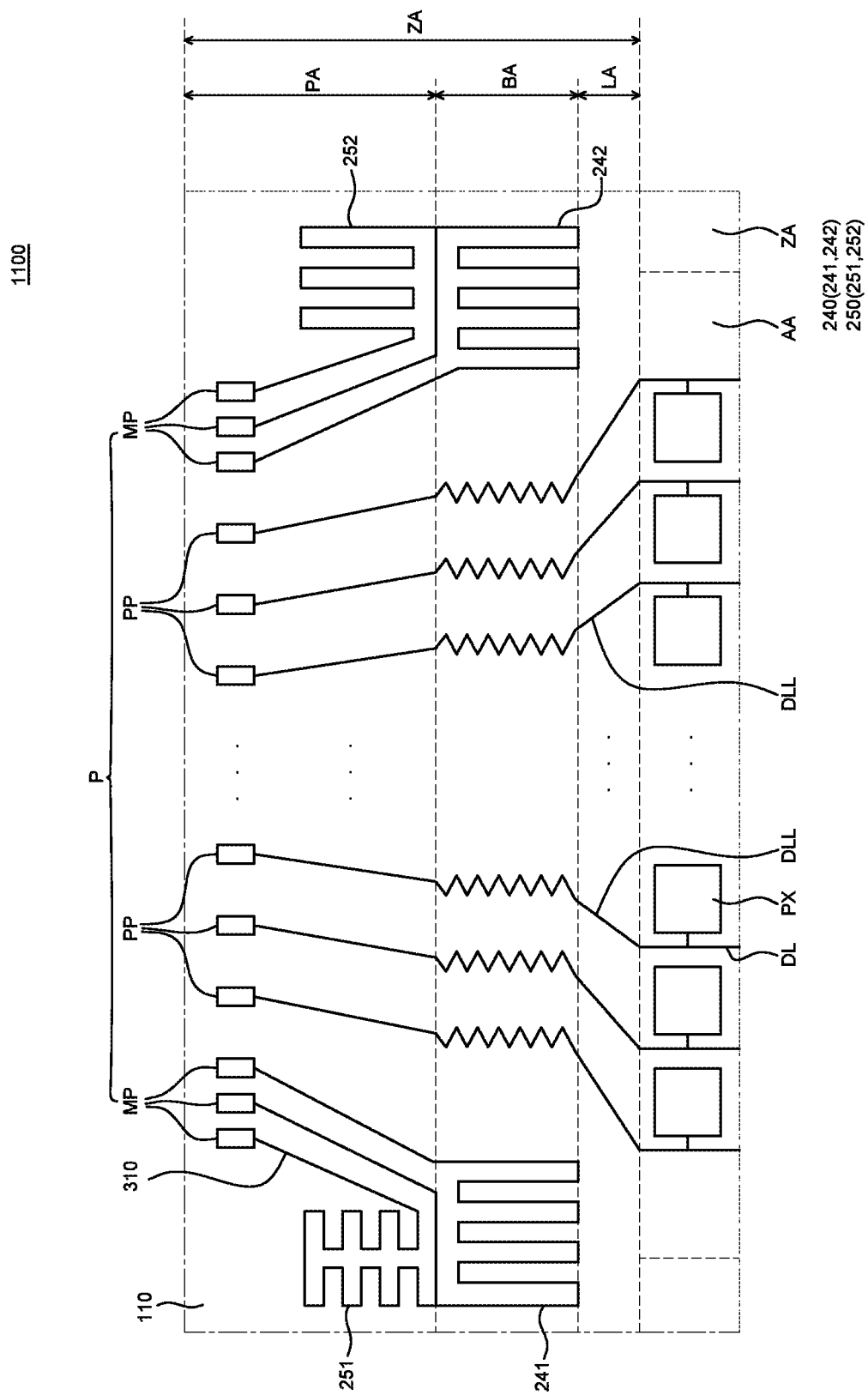
FIG. 12 is an enlarged plan view of a display device according to another example embodiment of the present disclosure.

As illustrated in FIG. 12, the plurality of data link lines DLL connected to the plurality of data lines DL can be located at a center portion of the flexible substrate 110. The bending monitoring pattern 240 can be disposed on both sides of the plurality of data link lines DLL. For example, the plurality of data link lines DLL can be located at a center portion of the bending area BA of the display device 1100 and the bending monitoring patterns 240 can be disposed on a left side and a right side of the plurality of data link lines DLL. However, the present disclosure is not limited thereto and the bending monitoring pattern 240 can be located on only one of the left side and the right side of the plurality of data link lines DLL disposed at the center portion of the bending area BA.

During the process of bending the bending area BA of the display device 1100, the bending area BA can be bent to be deviated from the design. For example, during the process of bending the display device 1100, the display device may not be exactly bent with respect to a boundary of the bending area BA and the link area LA and a boundary of the bending area BA and the pad area PA. When the display device is not exactly bent, the display device 1100 can be bend in a diagonal direction of the boundary of the bending area BA and the link area LA and the boundary of the bending area BA and the pad area PA. As described above, when the display device is not exactly bent, the bending monitoring patterns 240 disposed on both sides of the plurality of data link lines DLL can have different resistances.

When the display device is exactly bent, the center area C of the bending area BA can be formed in a first direction which can be a horizontal direction. The first direction which can be the horizontal direction can be perpendicular to the plurality of data link lines DLL. Alternatively, the first direction which can be the horizontal direction can be defined as a direction perpendicular to a second direction which can be a bending direction of the flexible substrate 110 of the display device 1100.

When the flexible substrate 110 of the display device 1100 is not exactly bent in the first direction, the center area C of the bending area BA can be formed in a diagonal direction. The diagonal direction can be an oblique direction which has a predetermined angle from the first direction which can be the horizontal direction.

When the display device 1100 is bent in a diagonal direction with respect to the boundary of the bending area BA and the link area LA, the bending monitoring pattern 240 disposed on both sides of the plurality of data line lines DLL can have different resistances. As described above, when the display device 1100 is bent to be deviated, a difference between a resistance of the first bending monitoring pattern 241 disposed on the left side of the data link line DLL and a resistance of the second bending monitoring pattern 242 disposed on the right side of the data link line DLL can be significant. Therefore, it can be determined whether the display device 1100 is exactly bent by comparing the resistance of the first bending monitoring pattern 241 and the resistance of the second bending monitoring pattern 242.

When the display device 1100 is exactly bent, the first bending monitoring pattern 241 disposed on the left side of the data link line DLL and the second bending monitoring pattern 242 disposed on the right side of the data link line DLL have the substantially same bending degree. Therefore, the resistance of the first bending monitoring pattern 241 and the resistance of the second bending monitoring pattern 242 can be substantially the same.

As illustrated in FIG. 12, the first bending monitoring pattern 241 and the second bending monitoring pattern 242 disposed in the bending area BA of the display device 1100 can have the same shape. Further, the first temperature monitoring pattern 251 and the second temperature monitoring pattern 252 can have different shapes.

The bending monitoring pattern 240 can have a protruding portion and a recessed portion. The protruding portion of the bending monitoring pattern 240 can protrude in the second direction which can be perpendicular to the first direction which can be a horizontal direction. The recessed portion of the bending monitoring pattern 240 can be formed to be recessed in the second direction. The second direction can be the same direction as the bending direction of the flexible substrate 110 of the display device 1100. The bending monitoring pattern 240 can be a pattern for monitoring a bending degree of the flexible substrate 110. Therefore, the protruding direction of the protruding portion of the bending monitoring pattern 240 and the recessed direction of the recessed portion can be formed in the same direction as the bending direction of the flexible substrate 110. Therefore, the first bending monitoring pattern 241 disposed on the left side of the data link line DLL and the second bending monitoring pattern 242 disposed on the right side of the data link line DLL can have the same patterned shape.

Referring to FIG. 12, the plurality of data link lines DLL connected to the plurality of data lines DL can be located at a center portion of the flexible substrate 110. The temperature monitoring pattern 250 can be disposed on both sides of the data link lines DLL. The first temperature monitoring pattern 251 disposed in the pad area PA of the flexible substrate 110 of the display device 1100 can have a different shape from that of the second temperature monitoring pattern 252. However, the present disclosure is not limited thereto and the first temperature monitoring pattern 251 and the second temperature monitoring pattern 252 can have the same shape.

At least one of the first temperature monitoring pattern 251 and the second temperature monitoring pattern 252 can have a different shape from the bending monitoring pattern 240. For example, at least one of the first temperature monitoring pattern 251 and the second temperature monitoring pattern 252 can have a protruding portion which protrudes in the first direction which can be a horizontal direction and a recessed portion which can be recessed in the first direction. Referring to FIG. 12, the first temperature monitoring pattern 251 between the first temperature monitoring pattern 251 and the second temperature monitoring pattern 252 can have the different shape from that of the bending monitoring pattern 240. The first temperature monitoring pattern 251 can have a protruding portion which protrudes in the first direction which can be a horizontal direction and a recessed portion which can be recessed in the first direction. Similarly to the bending monitoring pattern 240, the second temperature monitoring pattern 252 can have a protruding portion which protrudes in the second direction which can be perpendicular to the first direction and a recessed portion which can be recessed in the second direction. However, the present disclosure is not limited thereto. For example, the first temperature monitoring pattern 251 disposed on the left side of the plurality of data link line DLL has the same shape as that of the bending monitoring pattern 240. The second temperature monitoring pattern 252 disposed on the right side of the plurality of data link line DLL has a different shape from that of the bending monitoring pattern 240.

The plurality of pads P of the pad area PA can include a plurality of pixel pads PP and a plurality of monitoring pads MP disposed on the right side and the left side of the plurality of pixel pads PP. The plurality of pixel pads PP can be electrically connected to the plurality of pixels PX of the active area AA through the plurality of data link lines DLL. Referring to FIG. 12, the first temperature monitoring pattern 251 and the first bending monitoring pattern 241 can share one of a plurality of monitoring pads MP formed in the left side of the plurality of pixel pads PP. And, the second temperature monitoring pattern 252 and the second bending monitoring pattern 242 can share one of a plurality of monitoring pads MP formed in the right side of the plurality of pixel pads PP.

The example embodiments of the present disclosure can also be described by way of the display device according to the example embodiments of the present disclosure as follows:

According to an aspect of the present disclosure, a display device includes: a flexible substrate having an active area, a bezel area enclosing the active area, and a bending area defined in at least a part of the active area and the bezel area; and a plurality of bending sensing patterns disposed in the bending area, in which the bending area includes a plurality of sub bending areas and the plurality of bending sensing patterns can be disposed in different areas of the plurality of sub bending areas.

According to another aspect of the present disclosure, the plurality of sub bending areas can be sequentially disposed from one side to another side of the bending area.

According to still another aspect of the present disclosure, the bezel area can further include a link area extending from one side of the active area and the bending area can extend from one side of the link area to be defined only in the bezel area, and the plurality of bending sensing patterns can be disposed on both sides of the plurality of data link lines disposed in the bending area.

According to still another aspect of the present disclosure, the bending area can be defined in a partial area of the active area and on both sides of the partial area and the plurality of bending sensing patterns can be disposed in the bending area defined on the both sides of the partial area.

According to still another aspect of the present disclosure, the plurality of bending sensing patterns can be disposed in one line along a bending direction of the bending area.

According to still another aspect of the present disclosure, the plurality of bending sensing patterns can be disposed in a diagonal direction to a bending direction of the bending area.

According to still another aspect of the present disclosure, the plurality of bending sensing patterns can be configured by a plurality of sub patterns extending in different directions.

According to still another aspect of the present disclosure, at least some of the plurality of sub patterns can be parallel to a bending direction of the bending area.

According to another aspect of the present disclosure, the display device can further include: a thin film transistor on the flexible substrate, a first planarization layer on the thin film transistor, a second planarization layer on the first planarization layer, and a light emitting element on the second planarization layer and the plurality of bending sensing patterns can be disposed on the first planarization layer.

According to another aspect of the present disclosure, the second planarization layer can include a first planarization pattern covering the plurality of bending sensing patterns and a second planarization pattern covering the plurality of data link lines disposed in the bending area and can be spaced apart from the first planarization pattern.

According to still another aspect of the present disclosure, the second planarization layer can include a plurality of planarization patterns covering the plurality of bending sensing patterns, respectively, and being spaced apart from each other.

According to still another aspect of the present disclosure, at least some of the plurality of sub bending areas can have different radius of curvature.

According to still another aspect of the present disclosure, at least some of the plurality of sub bending areas can have different widths.

According to still another aspect of the present disclosure, at least some of the plurality of bending sensing patterns can have different widths in a bending direction of the bending area.

According to still another aspect of the present disclosure, the display device can further include: a plurality of bending sensing lines connected to the plurality of bending sensing patterns, respectively, a plurality of pads connected to the plurality of bending sensing lines, respectively, a chip on film (COF) connected to the plurality of pads, and a printed circuit board connected to the chip on film in which the printed circuit board includes a plurality of measurement pads electrically connected to the plurality of pads, respectively.

According to still another aspect of the present disclosure, the display device can further include: a resistance sensing pattern disposed in a part of the bezel area excluding the bending area and a plurality of resistance sensing lines connected to the resistance sensing pattern and some of the plurality of resistance sensing lines and some of the plurality of bending sensing lines can share some of the plurality of pads.

According to still another aspect of the present disclosure, a display device includes: a flexible substrate including a plurality of sub bending areas and having a curved bending area and a plurality of bending sensing patterns disposed in the plurality of sub bending areas, respectively, to detect a stress deviation in each of the sub bending areas generated as the bending area is bent.

According to still another aspect of the present disclosure, the plurality of bending sensing patterns can be formed of an uppermost conductive layer among conductive layers disposed in the bending area.

According to still another aspect of the present disclosure, the display device can further include a planarization layer disposed to cover the plurality of bending sensing patterns and the planarization layer can be configured such that a portion covering the plurality of bending sensing patterns and a portion covering lines can be separated from each other to reduce the propagation of cracks to the lines, and the lines can be disposed on the same layer as the plurality of bending sensing patterns.

According to still another aspect of the present disclosure, a first bending sensing pattern and a second bending sensing pattern of the plurality of bending sensing patterns can have different widths in a bending direction of the bending area.

According to still another aspect of the present disclosure, the plurality of bending sensing patterns can be aligned in a direction parallel to a bending direction of the bending area to minimize a size of the bending area.

According to still another aspect of the present disclosure, at least some of the plurality of sub bending areas can have different radius of curvature and a width in the bending direction of a sub bending area having a relatively small radius of curvature among the plurality of sub bending areas can be smaller than a width in the bending direction of a sub bending area having a relatively large radius of curvature.

According to another aspect of the present disclosure, a display device includes: a flexible substrate including an active area and a bezel area enclosing the active area in which the bezel area includes a bending area and a pad area where a plurality of pads are formed; a plurality of monitoring pads disposed in the pad area, a bending monitoring pattern which is disposed in the bending area and is electrically connected to at least two of the plurality of monitoring pads, and a temperature monitoring pattern which is disposed in the pad area and is electrically connected to at least two of the plurality of monitoring pads. The temperature monitoring pattern and the bending monitoring pattern can share one of the plurality of monitoring pads.

According to another aspect of the present disclosure, the plurality of monitoring pads can include a first monitoring pad, a second monitoring pad, and a third monitoring pad.

According to still another aspect of the present disclosure, one end of the bending monitoring pattern can be electrically connected to the second monitoring pad and the other end of the bending monitoring pattern can be electrically connected to the third monitoring pad.

According to still another aspect of the present disclosure, one end of the temperature monitoring pattern can be electrically connected to the first monitoring pad and the other end of the temperature monitoring pattern can be electrically connected to the second monitoring pad.

According to still another aspect of the present disclosure, the temperature monitoring pattern and the bending monitoring pattern can share the second monitoring pad.

According to still another aspect of the present disclosure, the display device can further include a plurality of connection lines which electrically connect the bending monitoring pattern and the temperature monitoring pattern to the plurality of monitoring pads and the plurality of connection lines can include a first connection line, a second connection line, and a third connection line.

According to still another aspect of the present disclosure, one end of the bending monitoring pattern can be electrically connected to the second monitoring pad through the second connection line and the other end of the bending monitoring pattern can be electrically connected to the third monitoring pad through the third connection line.

According to still another aspect of the present disclosure, one end of the temperature monitoring pattern can be electrically connected to the first monitoring pad through the first connection line and the other end of the temperature monitoring pattern can be electrically connected to the second monitoring pad through the second connection line.

According to still another aspect of the present disclosure, the temperature monitoring pattern and the bending monitoring pattern can share the second monitoring pad and the second connection line.

According to still another aspect of the present disclosure, the temperature monitoring pattern can include a protruding portion which protrudes in a first direction and a recessed portion which is recessed in the first direction and the bending monitoring pattern can include a protruding portion which protrudes in a second direction which is perpendicular to the first direction and a recessed portion which is recessed in the second direction.

According to still another aspect of the present disclosure, the second direction can be the same as the bending direction of the flexible substrate.

According to another example embodiment of the present disclosure, a display device includes a flexible substrate which includes an active area including a plurality of data lines which transmits a data signal and a plurality of pixels electrically connected to the plurality of data lines and a bezel area enclosing the active area, the bezel area including a bending area and a pad area where a plurality of pads is formed, a plurality of data link lines which is disposed at a center portion of the flexible substrate and is connected to the data lines, a first bending monitoring pattern and a second bending monitoring pattern which can be disposed in the bending area, the first bending monitoring pattern and the second bending monitoring pattern being disposed on a left side and a right side of the plurality of data link lines, respectively, and a first temperature monitoring pattern and a second temperature monitoring pattern which can be disposed in the pad area, the first temperature monitoring pattern and the second temperature monitoring pattern being disposed on the left side and the right side of the plurality of data link lines, respectively. The first bending monitoring pattern and the second bending monitoring pattern can include a protruding portion which protrudes in a second direction which is the same as the bending direction of the flexible substrate and a recessed portion which is recessed in the second direction.

According to another aspect of the present disclosure, at least one of the first temperature monitoring pattern and the second temperature monitoring pattern can include a protruding portion which protrudes in a first direction which is perpendicular to the second direction and a recessed portion which is recessed in the first direction.

According to another aspect of the present disclosure, the plurality of pads of the pad area can include the plurality of pixel pads electrically connected to the plurality of pixels of the active area through the plurality of data link lines and a plurality of monitoring pads disposed on the right side and the left side of the plurality of pixel pads.

According to another aspect of the present disclosure, the first temperature monitoring pattern and the first bending monitoring pattern can share one of a plurality of monitoring pads formed in the left side of the plurality of pixel pads.

According to another aspect of the present disclosure, the second temperature monitoring pattern and the second bending monitoring pattern can share one of a plurality of monitoring pads formed in the right side of the plurality of pixel pads.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure can be provided for illustrative purposes only but not intended to limit the technical concept of the present disclosure. The scope of the technical concept of the present disclosure is not limited thereto. Therefore, it should be understood that the above-described example embodiments can be illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a flexible substrate having an active area, a bezel area enclosing the active area, and a bending area defined in at least a part of the active area and the bezel area; and
   a plurality of bending sensing patterns disposed in the bending area,
   wherein the bending area includes a plurality of sub bending areas, wherein the plurality of bending sensing patterns are disposed in different areas of the plurality of sub bending areas,
   wherein the plurality of bending sensing patterns are configured by a plurality of sub patterns extending in different directions, and
   wherein the plurality of sub patterns of the plurality of bending sensing patterns adjacent to each other are disposed so as not to overlap each other in a direction perpendicular to a bending direction of the bending area.

2. The display device according to claim 1, wherein the plurality of sub bending areas are sequentially disposed from one side to another side of the bending area.

3. The display device according to claim 1, further comprising a plurality of data link lines disposed in the bending area,
   wherein the bezel area further includes a link area extending from one side of the active area,
   wherein the bending area extends from one side of the link area e defined only in the bezel area, and
   wherein the plurality of bending sensing patterns disposed on both sides of plurality of data link lines.

4. The display device according to claim 1, wherein the bending area is defined in a partial area of the active area and on both sides of the partial area, and the plurality of bending sensing patterns are disposed in the bending area defined on the both sides of the partial area.

5. The display device according to claim 1, wherein the plurality of bending sensing patterns are disposed in one line along the bending direction of the bending area.

6. The display device according to claim 1, wherein the plurality of bending sensing patterns are disposed in a diagonal direction to the bending direction of the bending area.

7. The display device according to claim 1, wherein at least some of the plurality of sub patterns are parallel to the bending direction of the bending area.

8. The display device according to claim 1, further comprising:
   a thin film transistor on the flexible substrate;
   a first planarization layer on the thin film transistor;
   a second planarization layer on the first planarization layer; and
   a light emitting element on the second planarization layer,
   wherein the plurality of bending sensing patterns are disposed on the first planarization layer.

9. The display device according to claim 8, further comprising a plurality of data link lines disposed in the bending area,
   wherein the second planarization layer includes a first planarization pattern covering the plurality of bending sensing patterns and a second planarization pattern covering the plurality of data link lines, and is spaced apart from the first planarization pattern.

10. The display device according to claim 8, wherein the second planarization layer includes a plurality of planarization patterns covering the plurality of bending sensing patterns, respectively, and being spaced apart from each other.

11. The display device according to claim 1, wherein at, least some of the plurality of sub bending areas have different radius of curvature.

12. The display device according to claim 1, wherein at least some of the plurality of sub bending areas have different widths.

13. The display device according to claim 1, wherein at least some of the plurality of bending sensing patterns have different widths in the bending direction of the bending area.

14. The display device according to claim 1, further comprising:
- a plurality of bending sensing lines connected to the plurality of bending sensing patterns, respectively;
- a plurality of pads connected to the plurality of bending sensing lines, respectively;
- a chip on film (COP) connected to the plurality of pads; and
- a printed circuit board connected to the chip on film,
- wherein the printed circuit board includes a plurality of measurement pads electrically connected to the plurality of pads, respectively.

15. The display device according to claim 14, further comprising:
- a resistance sensing pattern disposed in a part of the bezel area excluding the bending area; and
- a plurality of resistance sensing lines connected to the resistance sensing pattern,
- wherein some of the plurality of resistance sensing lines and some of the plurality of bending sensing lines share some of the plurality of pads.

16. A display device, comprising:
- a flexible substrate including a plurality of sub bending areas and having a curved bending area;
- a plurality of bending sensing patterns disposed in the plurality of sub bending areas, respectively, to detect a stress deviation in each of the plurality of sub bending areas generated as the bending area is bent,
- a planarization layer disposed to cover the plurality of bending sensing patterns; and
- lines disposed on a same layer as the plurality of bending sensing patterns,
- wherein the planarization layer includes a portion covering the plurality of bending sensing patterns and a portion covering the lines that are separated from each other to reduce a propagation of cracks to the lines.

17. The display device according to claim 16, wherein the plurality of bending sensing patterns are formed of an uppermost conductive layer among conductive layers disposed in the bending area.

18. The display device according to claim 16, wherein a first bending sensing pattern and a second bending sensing pattern of the plurality of bending sensing patterns have different widths in a bending direction of the bending area.

19. The display device according to claim 16, wherein the plurality of bending sensing patterns are aligned in a direction parallel to a bending direction of the bending area to minimize a size of the bending area.

20. The display device according to claim 16, wherein at least some of the plurality of sub bending areas have different radius of curvature, and
- wherein a width in a bending direction of a sub bending area having a relatively small radius of curvature among the plurality of sub bending areas is smaller than a width in the bending direction of a sub bending area having a relatively large radius of curvature.

21. A display device, comprising:
- a flexible substrate including an active area and a bezel area enclosing the active area, the bezel area including a bending area and a pad area, where a plurality of pads are formed;
- a plurality of monitoring pads disposed in the pad area;
- a bending monitoring pattern disposed in the bending area, the bending monitoring pattern being electrically connected to at least two of the plurality of monitoring pads; and
- a temperature monitoring pattern disposed in the pad area, the temperature monitoring pattern being electrically connected to at least two of the plurality of monitoring pads,
- wherein the temperature monitoring pattern and the bending monitoring pattern share one of the plurality of monitoring pads.

22. The display device according to claim 21, wherein the plurality of monitoring pads include a first monitoring pad, a second monitoring pad, and a third monitoring pad.

23. The display device according to claim 22, further comprising:
- a plurality of connection lines electrically connecting the bending monitoring pattern and the temperature monitoring pattern to the plurality of monitoring pads, the plurality of connection lines including a first connection line, a second connection line, and a third connection line.

24. The display device according to claim 23, wherein one end of the bending monitoring pattern being electrically connected to the second monitoring pad through the second connection line, and the other end of the bending monitoring pattern being electrically connected to the third monitoring pad through the third connection line.

25. The display device according to claim 24, wherein one end of the temperature monitoring pattern being electrically connected to the first monitoring pad through the first connection line, and the other end of the temperature monitoring pattern being electrically connected to the second monitoring pad through the second connection line.

26. The display device according to claim 25, wherein the temperature monitoring pattern and the bending monitoring pattern share the second monitoring pad and the second connection line.

27. The display device according to claim 22, wherein one end of the bending monitoring pattern being electrically connected to the second monitoring pad, and the other end of the bending monitoring pattern being electrically connected to the third monitoring pad.

28. The display device according to claim 27, wherein one end of the temperature monitoring pattern being electrically connected to the first monitoring pad, and the other end of the temperature monitoring pattern being electrically connected to the second monitoring pad.

29. The display device according to claim 28, wherein the temperature monitoring pattern and the bending monitoring pattern share the second monitoring pad.

30. The display device according to claim 21, wherein the temperature monitoring pattern includes a first protruding portion which protrudes in a first direction and a first recessed portion which is recessed in the first direction, and the bending monitoring pattern includes a second protruding portion which protrudes in a second direction which is perpendicular to the first direction and a second recessed portion which is recessed in the second direction.

31. The display device according to claim 30, wherein the second direction being the same as a bending direction of the flexible substrate.

* * * * *